United States Patent
Yamazaki

(10) Patent No.: US 9,006,733 B2
(45) Date of Patent: Apr. 14, 2015

(54) SEMICONDUCTOR DEVICE AND METHOD FOR MANUFACTURING THEREOF

(71) Applicant: Semiconductor Energy Laboratory Co., Ltd., Atsugi-shi, Kanagawa-ken (JP)

(72) Inventor: Shunpei Yamazaki, Tokyo (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 13/741,481

(22) Filed: Jan. 15, 2013

(65) Prior Publication Data

US 2013/0193493 A1    Aug. 1, 2013

(30) Foreign Application Priority Data

Jan. 26, 2012 (JP) ................. 2012-014049

(51) Int. Cl.
*H01L 29/10* (2006.01)
*H01L 29/78* (2006.01)
*H01L 29/66* (2006.01)
*H01L 29/786* (2006.01)
*H01L 27/12* (2006.01)

(52) U.S. Cl.
CPC .......... *H01L 29/78* (2013.01); *H01L 29/66477* (2013.01); *H01L 29/7869* (2013.01); *H01L 27/1225* (2013.01)

(58) Field of Classification Search
CPC .................. H01L 27/1225; H01L 29/7869
USPC ............................ 257/43, E33.064, E31.126
See application file for complete search history.

(56) References Cited

U.S. PATENT DOCUMENTS 5,731,856 A    3/1998  Kim et al.
5,744,864 A    4/1998  Cillessen et al.
(Continued)

FOREIGN PATENT DOCUMENTS

EP    1 737 044 A1    12/2006
EP    2 226 847 A2     9/2010
(Continued)

OTHER PUBLICATIONS

Asakuma, N et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.
(Continued)

*Primary Examiner* — Amar Movva
(74) *Attorney, Agent, or Firm* — Fish & Richardson P.C.

(57) ABSTRACT

In a semiconductor device including a transistor using an oxide semiconductor film, stable electric characteristics can be provided and high reliability can be achieved. A structure of the semiconductor device, which achieves high-speed response and high-speed operation, is provided. In a semiconductor device including a transistor in which an oxide semiconductor film, a gate insulating film, and a gate electrode layer are stacked in order and a sidewall insulating layer is provided on the side surface of the gate electrode layer, the sidewall insulating layer has an oxygen-excess regions, which is formed in such a manner that a first insulating film is formed and then is subjected to oxygen doping treatment, a second insulating is formed over the first insulating film, and a stacked layer of the first insulating film and the second insulating film are etched.

15 Claims, 12 Drawing Sheets

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 * | 9/2006 | Nause et al. ............. 257/192 |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0077520 A1* | 4/2005 | Zhang ............. 257/72 |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2011/0263083 A1 | 10/2011 | Yamazaki |
| 2012/0161124 A1 | 6/2012 | Yamazaki |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 A | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2011-181801 A | 9/2011 |
| WO | 2004/114391 A1 | 12/2004 |

OTHER PUBLICATIONS

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: AL and SN-Doped Zinc Indium Oxide Thin Film Transistors for AMOLED Back-Plane," SID Digest '09 : SID International Symposium Digest of Technical Papers, May 31, 2009, pp. 280-283.

Clark, S et al., "First Principles Methods Using CASTEP," Zeitschrift fur Kristallographie, 2005, vol. 220, pp. 567-570.

Coates. D et al., "Optical Studies of the Amorphous Liquid-Cholesteric Liquid Crystal Transition: The Blue Phase," Physics Letters, Sep. 10, 1973, vol. 45A, No. 2, pp. 115-116.

Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZNO Thin-Film Transistors Produced at Room Temperature," Appl. Phys. Lett. (Applied Physics Letters), Sep. 27, 2004, vol. 85, No. 13, pp. 2541-2543.

(56) References Cited

OTHER PUBLICATIONS

Fung, T et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In—Ga—Zn—Oxide TFT," SID Digest '09 : SID International Symposium Digest of Technical Papers, May 31, 2009, pp. 1110-1112.

Godo, H et al., "Temperature Dependence of Characteristics and Electronic Structure for Amorphous In—Ga—Zn—Oxide TFT," AM-FPD '09 Digest of Technical Papers, Jul. 1, 2009, pp. 41-44.

Hayashi, R et al., "42.1: Invited Paper: Improved Amorphous In—Ga—Zn—O TFTs," SID Digest '08 : SID International Symposium Digest of Technical Papers, May 20, 2008, vol. 39, pp. 621-624.

Hirao, T et al., "Novel Top-Gate Zinc Oxide Thin-Film Transistors (ZNO TFTs) for AMLCDS," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda, T et al., "Full-Functional System Liquid Crystal Display Using CG-Silicon Technology," SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, No. 16, pp. 165202-1-165202-22.

Janotti, A et al., "Oxygen Vacancles in ZnO," Appl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium-Gallium-Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.

Kanno, H et al., "White Stacked Electrophosphorecent Organic Light-Emitting Devices Employing MOO3 As a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases," Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kimizuka, N et al., "Spinel,YBFE2O4, and YB2FE3O7 Types of Structures for Compounds in the IN2O3 and SC2O3—A2O3—BO Systems [A; FE, GA, or AL; B: MG, MN, FE, NI, CU,or ZN] at Temperatures Over 1000° C," Journal of Solid State Chemistry, 1985, vol. 60, pp. 382-384.

Kimizuka, N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits , 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World'S Largest (15-Inch) XGA AMLCD Panel Using IGZO Oxide TFT," SID Digest '08 : SID International Symposium Digest of Technical Papers, May 20, 2008, vol. 39, pp. 625-628.

Lee, M et al., "15.4: Excellent Performance of Indium-Oxide-Based Thin-Film Transistors by DC Sputtering," SID Digest '09 : SID International Symposium Digest of Technical Papers, May 31, 2009, pp. 191-193.

Li, C et al "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "Suftla Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with New Long-Period Structure," NIRIM Newsletter, Mar. 1995, vol. 150, pp. 1-4 with English Translation.

Nakamura, M et al., "The phase relations in the In2O3—Ga2ZnO4—ZnO system at 1350° C," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors," Jpn. J. Appl. Phys. (Japanese Journal of Applied Physics) , 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline InGaO3(ZnO)5 films," Appl. Phys. Lett. (Applied Physics Letters) , Sep. 13, 2004, vol. 85, No. 11, pp. 1993-1995.

Nowatari, H et al., "60.2: Intermediate Connector With Suppressed Voltage Loss for White Tandem OLEDS," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZNO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 in. QVGA AMOLED Display Using In—Ga—Zn—Oxide TFTs With a Novel Passivation Layer," SID

(56) References Cited

OTHER PUBLICATIONS

Digest '09 : SID International Symposium Digest of Technical Papers, May 31, 2009, pp. 284-287.

Ohara, H et al., "Amorphous In—Ga—Zn—Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Orita, M et al., "Amorphous transparent conductive oxide InGaO3(ZnO)m (m<4):a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al., "15.2: Development of Driver-Integrated Panel using Amorphous In—Ga—Zn—Oxide TFT," SID Digest '09 : SID International Symposium Digest of Technical Papers, May 31, 2009, pp. 184-187.

Osada, T et al., "Development of Driver-Integrated Panel Using Amorphous In—Ga—Zn—Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium-Gallium-Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium-Gallium-Zinc Oxide TFTs and Their Application for Large Size AMOLED," AM-FPD '08 Digest of Technical Papers, Jul. 2, 2008, pp. 275-278.

Park, S et al., "Challenge to Future Displays: Transparent AM-OLED Driven by Peald Grown ZNO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-In. AMOLED Display With Driver Circuit Using Amorphous In—Ga—Zn—Oxide TFTs," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous GIZO (Ga2O3—In2O3—ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistor on SrTiO3 with Sputtered Al2O3 Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

\* cited by examiner

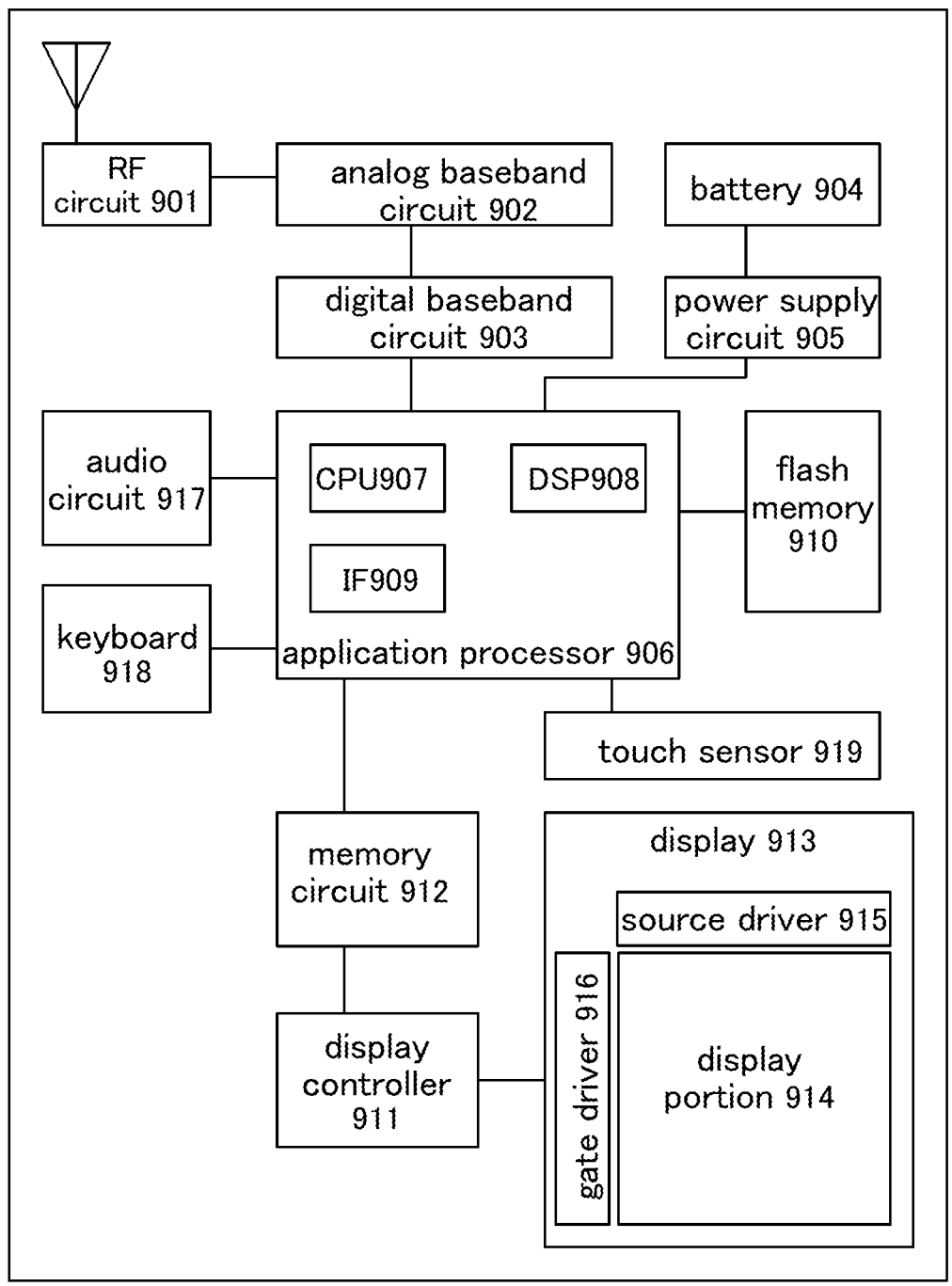

SEMICONDUCTOR DEVICE AND METHOD FOR MANUFACTURING THEREOF

BACKGROUND OF THE INVENTION

1. Field of the Invention

The present invention relates to a semiconductor device and a method for manufacturing thereof.

In this specification, a semiconductor device generally means a device which can function by utilizing semiconductor characteristics, and an electrooptic device, a semiconductor circuit, and an electronic device are all semiconductor devices.

2. Description of the Related Art

Attention has been focused on a technique for forming a transistor using a semiconductor thin film formed over a substrate having an insulating surface (also referred to as a thin film transistor (TFT)). The transistor is applied to a wide range of electronic devices such as an integrated circuit (IC) or an image display device (display device). A silicon-based semiconductor material is widely known as a material for a semiconductor thin film applicable to a transistor. As another material, an oxide semiconductor has been attracting attention.

For example, a transistor including a semiconductor layer formed using an amorphous oxide containing indium (In), gallium (Ga), and zinc (Zn) (In—Ga—Zn—O-based amorphous oxide) is disclosed (see Patent Document 1).

REFERENCE

Patent Document

[Patent Document 1] Japanese Published Patent Application No. 2011-181801

SUMMARY OF THE INVENTION

Oxygen vacancies in an oxide semiconductor serve as donors to generate electrons that are carriers in the oxide semiconductor. Many oxygen vacancies in an oxide semiconductor including a channel formation region of a transistor lead to generation of electrons in the channel formation region, which causes a shift of the threshold voltage of the transistor in the negative direction.

An object of one embodiment of the present invention is to provide a highly reliable semiconductor device including a transistor using an oxide semiconductor film, which has stable electric characteristics.

In order to achieve high-speed operation, low power consumption, high integration, or the like of a transistor, it is necessary to miniaturize a transistor.

An object is to provide a structure of a semiconductor device which achieves high-speed response and high-speed operation by improving on-state characteristics of a miniaturized transistor (e.g., on-state current or field-effect mobility), and to provide a manufacturing method thereof, in order to achieve a high-performance semiconductor device.

In a semiconductor device including a transistor in which an oxide semiconductor film, a gate insulating film, and a gate electrode layer are stacked in order and a sidewall insulating layer is provided on the side surface of the gate electrode layer, the sidewall insulating layer has an oxygen-excess region. The sidewall insulating layer is formed in such a manner that a first insulating film is formed and then is subjected to oxygen doping treatment, a second insulating film is formed over the first insulating film, and the stacked layer of the first insulating film and the second insulating film is etched.

By the oxygen doping treatment, at least one oxygen-excess region where contained oxygen exceeds the stoichiometric composition can be provided in the first insulating film. The sidewall insulating layer is formed in such a manner that the second insulating film is stacked over the first insulating film provided with the oxygen-excess region; thus, the oxygen-excess region can be included in the sidewall insulating layer. Further, by the oxygen doping treatment, oxygen can also be supplied to the gate insulating film and the oxide semiconductor film which are positioned below the first insulating film.

The oxygen-excess region is provided in the vicinity between the first insulating film and the second insulating film (or in the first insulating film). Accordingly, it is preferable that the thicknesses of the first insulating film and the second insulating film are adjusted such that they can serve as a sidewall insulating layer by making the first insulating film on the side of the oxide semiconductor film and the gate insulating film thinner and making the second insulating film thicker than the first insulating film. For example, the first insulating film has a thickness of greater than or equal to 20 nm and less than or equal to 50 nm (typically, 30 nm), and the second insulating film has a thickness of greater than or equal to 200 nm and less than or equal to 500 nm (typically, 370 nm).

The sidewall insulating layer filled with excess oxygen in a region adjacent to the oxide semiconductor film and the gate insulating film prevents elimination of oxygen from the gate insulating film and the oxide semiconductor film and effectively serves as an oxygen supplying layer which supplies oxygen to the oxide semiconductor film and the gate insulating film.

In the sidewall insulating layer, the excess oxygen stored in the region adjacent to the oxide semiconductor film and the gate insulating film can be supplied to the gate insulating film and the oxide semiconductor film effectively. Thus, in the semiconductor device, generation of a parasitic channel can be prevented and oxygen vacancies in the oxide semiconductor film and at the interface between the gate insulating film and the oxide semiconductor film can be compensated. Further, by performing heat treatment after the oxygen doping treatment, oxygen can be supplied to the oxide semiconductor film and the gate insulating film from the oxygen-excess region.

A barrier film (protective film) which prevents release of oxygen is preferably provided over the oxide semiconductor film, the gate insulating film, and the sidewall insulating layer having an oxygen-excess region.

An aluminum oxide film, for example, has a superior shielding effect (blocking effect), which is not permeable to either oxygen or impurities such as hydrogen and moisture. Thus, in and after the manufacturing process, by provision of an aluminum oxide film, the aluminum oxide film can serve as a barrier film that prevents entry of impurities such as hydrogen and moisture, which cause variation in electric characteristics, into the oxide semiconductor film and the sidewall insulating layer and release of oxygen from the oxide semiconductor film and the sidewall insulating layer.

One embodiment of the present invention disclosed in this specification is a semiconductor device including an oxide semiconductor film provided over an oxide insulating film and including a channel formation region; a gate insulating film over the oxide semiconductor film; a gate electrode layer over the gate insulating film; a sidewall insulating layer covering a part of a top surface of the gate insulating film and a side surface of the gate electrode layer; and a source electrode layer and a drain electrode layer which are electrically connected to the oxide semiconductor film. The sidewall insulating layer includes a first insulating film in contact with the oxide semiconductor film and a second insulating film thicker than the first insulating film on the first insulating film. The sidewall insulating layer is made to include an oxygen-excess region by performing oxygen doping treatment on the first insulating film and providing the second insulating film in contact with the first insulating film after the oxygen doping treatment.

One embodiment of the present invention is a semiconductor device, in which the source electrode layer and the drain electrode layer are in contact with the oxide semiconductor film and the sidewall insulating layer in the above-described structure.

One embodiment of a structure of the present invention disclosed in this specification is a method for manufacturing a semiconductor device, including the steps of forming an oxide insulating film; forming an oxide semiconductor film over the oxide insulating film; forming a gate insulating film over the oxide semiconductor film; forming a gate electrode layer overlapping with the oxide semiconductor film, over the gate insulating film; forming a first insulating film over the gate insulating film and the gate electrode layer; performing oxygen doping treatment on the first insulating film; forming a second insulating film over the first insulating film after the oxygen doping treatment; etching the first insulating film after the oxygen doping treatment and the second insulating film, thereby forming a sidewall insulating film covering a side surface of the gate electrode layer; and forming a source electrode layer and a drain electrode layer which are electrically connected to the oxide semiconductor film.

As the barrier film, a metal oxide film (typically, an aluminum oxide film) formed in such a manner that a metal film (typically, an aluminum film) is formed and then is subjected to oxygen doping treatment can be used. By the oxygen doping treatment, oxygen can be supplied to the sidewall insulating layer provided below the metal film.

Note that the "oxygen doping" means that oxygen (which includes at least one of an oxygen radical, an oxygen atom, an oxygen molecule, ozone, an oxygen ion (oxygen molecular ion), and/or an oxygen cluster ion) is added to a bulk. Note that the term "bulk" is used in order to clarify that oxygen is added not only to a surface of a thin film but also to the inside of the thin film. In addition, "oxygen doping" includes "oxygen plasma doping" in which oxygen which is made to be plasma is added to a bulk.

A gas containing oxygen can be used for oxygen doping treatment. As a gas containing oxygen, oxygen, dinitrogen monoxide, nitrogen dioxide, carbon dioxide, carbon monoxide, or the like can be used. Further, a rare gas may be included in the gas containing oxygen for the oxygen doping treatment.

By the condition of the oxygen doping treatment, not only a film directly exposed to the oxygen doping treatment but also a film provided below the film can be doped with oxygen.

In the above structure, a first oxide insulating film and a second oxide insulating film can be formed by a deposition method using a deposition gas. For example, the first oxide insulating film and the second oxide insulating film can be formed by a chemical vapor deposition (CVD) method.

Further, heat treatment (dehydration or dehydrogenation treatment) by which hydrogen or moisture is eliminated may be performed on the oxide insulating film to be a base, the oxide semiconductor film, the gate insulating film, the first insulating film, and the second insulating film which are included in the semiconductor device.

Low-resistance regions whose resistances are lower than that of the channel formation region and which include a dopant (an impurity element) are formed in the oxide semiconductor film so that the channel formation region is provided between the low-resistance regions, by introducing the dopant (the impurity element) into the oxide semiconductor film in a self-aligned manner with the use of the gate electrode layer as a mask. The dopant is an impurity by which the electrical conductivity of the oxide semiconductor film is changed. As the method for introducing the dopant, an ion implantation method, an ion doping method, a plasma immersion ion implantation method, or the like can be used.

With the oxide semiconductor film including the low-resistance regions between which the channel formation region is provided in the channel length direction, on-state characteristics (e.g., on-state current and field-effect mobility) of the transistor are increased, which enables high-speed operation and high-speed response of the transistor.

One embodiment of the present invention relates to a semiconductor device including a transistor or a semiconductor device including a circuit which is formed by using a transistor. For example, one embodiment of the present invention relates to a semiconductor device including a transistor in which a channel formation region is formed using an oxide semiconductor or a semiconductor device including a circuit which is formed by using such a transistor. For example, one embodiment of the present invention relates to an LSI, a CPU, a power device mounted in a power circuit, a semiconductor integrated circuit including a memory, a thyristor, a converter, an image sensor, or the like, an electro-optical device typified by a liquid crystal display panel, a light-emitting display device including a light-emitting element, or an electronic device including the aforementioned device as a component.

In a semiconductor device including a transistor using an oxide semiconductor film, stable electric characteristics can be provided and high reliability can achieved.

A structure of a semiconductor device including a transistor using an oxide semiconductor film, which achieves high-speed response and high-speed operation, and a manufacturing method thereof can be provided.

BRIEF DESCRIPTION OF THE DRAWINGS

FIG. 9 is a block diagram illustrating one embodiment of a semiconductor device.

DETAILED DESCRIPTION OF THE INVENTION

Hereinafter, embodiments of the invention disclosed in this specification will be described with reference to the accompanying drawings. Note that the invention disclosed in this specification is not limited to the following description, and it is easily understood by those skilled in the art that modes and details can be variously changed without departing from the spirit and the scope of the invention. Therefore, the invention disclosed in this specification is not construed as being limited to the description of the following embodiments. Note that the ordinal numbers such as "first" and "second" in this specification are used for convenience and do not denote the order of steps and the stacking order of layers. In addition, the ordinal numbers in this specification do not denote particular names which specify the present invention.

Embodiment 1

In this embodiment, one embodiment of a semiconductor device and a method for manufacturing the semiconductor device will be described with reference to FIGS. 1A to 1C. In this embodiment, a transistor including an oxide semiconductor film is described as an example of the semiconductor device.

The transistor may have a single-gate structure in which one channel formation region is formed, a double-gate structure in which two channel formation regions are formed, or a triple-gate structure in which three channel formation regions are formed. Alternatively, the transistor may have a dual-gate structure including two gate electrode layers positioned above and below a channel formation region with a gate insulating film provided therebetween.

Figure 1A:
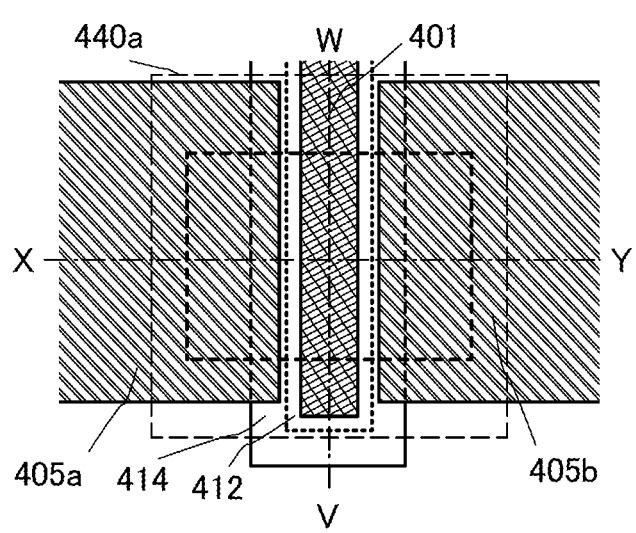
FIGS. 1A to 1C are a plan view and cross-sectional views which illustrate one embodiment of a semiconductor device.
Figure 1C:
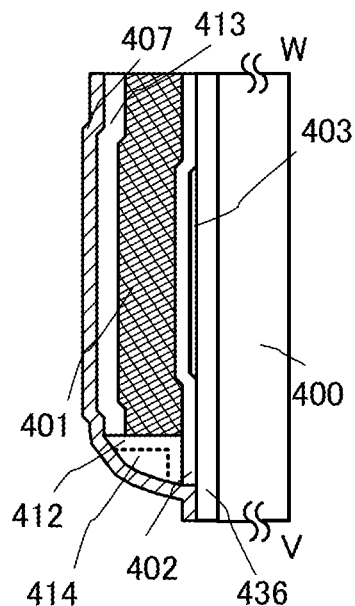

A transistor 440a illustrated in FIGS. 1A and 1C is an example of a top-gate transistor. FIG. 1A is a plan view of the transistor 440a, FIG. 1B is a cross-sectional view taken along line X-Y in FIG. 1A, and FIG. 1C is a cross-sectional view taken along line V-W in FIG. 1A. In FIGS. 1A to 1C, some of components of the transistor 440a are omitted to avoid complexity.

Figure 1B:
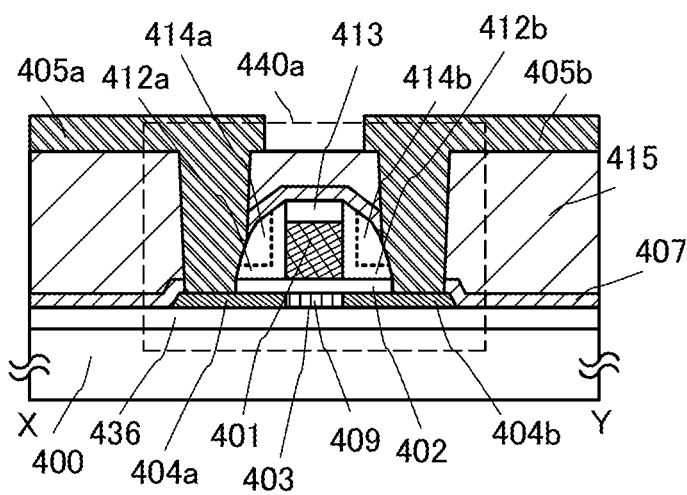

As illustrated in FIG. 1B, which is a cross-sectional view in the channel length direction, a semiconductor device including the transistor 440a includes, over a substrate 400 having an insulating surface over which an oxide insulating film 436 is provided, an oxide semiconductor film 403 including a channel formation region 409 and low-resistance regions 404a and 404b; a source electrode layer 405a; a drain electrode layer 405b; a gate insulating film 402; a gate electrode layer 401; a sidewall insulating layer provided in contact with the side surface of the gate electrode layer 401, including the stacked layer of the first insulating films 412a and 412b and the second insulating films 414a and 414b, and including an oxygen-excess region; an insulating film 413, an insulating film 407, and an interlayer insulating film 415.

In a manufacturing process of the sidewall insulating layer, oxygen doping treatment is performed on the surface of the first insulating film 412 (412a and 412b), and the second insulating film 414 (414a and 414b) is formed over the first insulating film 412 (412a and 412b) after the oxygen doping treatment as illustrated in FIGS. 1A to 1C. Thus, the sidewall insulating layer includes the oxygen-excess region.

The oxygen-excess region is provided in the vicinity between the first insulating films 412a and 412b and the second insulating films 414a and 414b (or in the first insulating film). Thus, it is preferable that the thicknesses of the first insulating films 412a and 412b and the second insulating films 414a and 414b are adjusted such that they can serve as the sidewall insulating layer by making the first insulating films 412a and 412b on the side of the oxide semiconductor film 403 and the gate insulating film 402 thinner and making the second insulating films 414a and 414b thicker than the first insulating films. For example, the first insulating films 412a and 412b each preferably have a thickness of greater than or equal to 20 nm and less than or equal to 50 nm (typically, 30 nm), and the second insulating films 414a and 414b each preferably have a thickness of greater than or equal to 200 nm and less than or equal to 500 nm (typically, 370 nm).

The sidewall insulating layer filled with excess oxygen in a region adjacent to the oxide semiconductor film 403 and the gate insulating film 402 prevents elimination of oxygen from the oxide semiconductor film 403 and the gate insulating film 402 and effectively serves as an oxygen supplying layer which supplies oxygen to the oxide semiconductor film 403 and the gate insulating film 402.

In the sidewall insulating layer, the excess oxygen stored in the region adjacent to the oxide semiconductor film 403 and the gate insulating film 402 can be effectively supplied to the oxide semiconductor film 403 and the gate insulating film 402. Thus, oxygen vacancies in the oxide semiconductor film 403 and at the interface between the gate insulating film and the oxide semiconductor film 403 can be compensated.

A barrier film (protective film) which prevents release of oxygen is preferably provided over the oxide semiconductor film 403, the gate insulating film 402, and the sidewall insulating layer having an oxygen-excess region.

In this embodiment, an insulating film 407 is provided as a barrier film. As the barrier film, a film containing an aluminum oxide film can be preferably used. Further, a stacked film in which a titanium oxide film, a nickel oxide film, a molybdenum oxide film, or a tungsten film is stacked under or on the aluminum oxide film may be provided as the barrier film.

An aluminum oxide film has a superior shielding effect (blocking effect), which is not permeable to either oxygen or impurities such as hydrogen and moisture. Thus, by provision of an aluminum oxide film as the barrier film, in and after the manufacturing process, the aluminum oxide film can serve as a barrier film that prevents entry of impurities such as hydrogen and moisture, which causes variation in electric characteristics, into the oxide semiconductor film and the sidewall insulating layer and release of oxygen from the oxide semiconductor film and the sidewall insulating layer.

When the density of the aluminum oxide film used as the insulating film 407 serving as a barrier film is set to high (the film density is higher than or equal to 3.2 g/cm$^3$, preferably higher than or equal to 3.6 g/cm$^3$), the transistor 440 can have stable electrical characteristics. The film density can be measured by Rutherford backscattering spectrometry (RBS) or X-ray reflection (XRR).

As illustrated in the cross-sectional view in the channel width direction, a side edge of the oxide semiconductor film 403 is covered with the gate insulating film 402, and the sidewall insulating layer (the first insulating film 412a and the second insulating film 414b) having the oxygen-excess region, which is an oxygen supplying layer, is formed over the gate insulating film 402. Further, the oxide semiconductor film 403, the gate insulating film 402, and the sidewall insulating layer are covered with the insulating film 407 serving as a barrier film that prevents release of oxygen. Accordingly, release of oxygen from the side edge of the oxide semiconductor film 403 is prevented, and oxygen vacancies can be compensated by supply of oxygen. Thus, generation of a parasitic channel can be suppressed.

A dopant is introduced into the oxide semiconductor film 403 in a self-aligned manner with the use of the gate electrode layer 401 as a mask, so that the low-resistance regions 404a and 404b between which the channel formation region 409 is sandwiched, which have lower resistances than the channel formation region 409, and which include a dopant are formed in the oxide semiconductor film 403. The dopant is an impurity (an impurity element) by which the conductivity of the oxide semiconductor film 403 is changed. As the method for introducing the dopant, an ion implantation method, an ion doping method, a plasma immersion ion implantation method, or the like can be used.

With the oxide semiconductor film 403 including the low-resistance regions 404a and 404b between which the channel formation region 409 is sandwiched in the channel length direction, on-state characteristics (e.g., on-state current and field-effect mobility) of the transistor 440a are increased, which enables high-speed operation and high-speed response of the transistor.

An oxide semiconductor used for the oxide semiconductor film 403 contains at least indium (In). In particular, In and zinc (Zn) are preferably contained. As a stabilizer for reducing variation in electric characteristics of a transistor including the oxide semiconductor, gallium (Ga) is preferably additionally included. Tin (Sn) is preferably contained as a stabilizer. Hafnium (Hf) is preferably contained as a stabilizer. Aluminum (Al) is preferably contained as a stabilizer. Zirconium (Zr) is preferably contained as a stabilizer.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

As the oxide semiconductor, for example, any of the following can be used: indium oxide; tin oxide; zinc oxide; a two-component metal oxide such as an In—Zn-based oxide, an In—Mg-based oxide, or an In—Ga-based oxide; a three-component metal oxide such as an In—Ga—Zn-based oxide (also referred to as IGZO), an In—Al—Zn-based oxide, an In—Sn—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide.

Note that here, for example, an "In—Ga—Zn-based oxide" means an oxide containing In, Ga, and Zn as its main component and there is no particular limitation on the ratio of In:Ga:Zn. The In—Ga—Zn-based oxide may contain a metal element other than the In, Ga, and Zn.

Alternatively, a material represented by $InMO_3(ZnO)_m$ (m>0 is satisfied, and m is not an integer) may be used as an oxide semiconductor. Note that M represents one or more metal elements selected from Ga, Fe, Mn, and Co. Alternatively, as the oxide semiconductor, a material expressed by a chemical formula, $In_2SnO_5(ZnO)_n$ (n>0, n is a natural number) may be used.

For example, an In—Ga—Zn-based oxide with an atomic ratio of In:Ga:Zn=1:1:1 (=1/3:1/3:1/3), In:Ga:Zn=2:2:1 (=2/5:2/5:1/5), In:Ga:Zn=3:1:2 (=1/2:1/6:1/3), or any of oxides whose composition is in the neighborhood of the above compositions can be used. Alternatively, an In—Sn—Zn-based oxide with an atomic ratio of In:Sn:Zn=1:1:1 (=1/3:1/3:1/3), In:Sn:Zn=2:1:3 (=1/3:1/6:1/2), or In:Sn:Zn=2:1:5 (=1/4:1/8:5/8), or any of oxides whose composition is in the neighborhood of the above compositions may be used.

However, without limitation to the materials given above, a material with an appropriate composition may be used as the oxide semiconductor containing indium depending on needed semiconductor characteristics (e.g., mobility, threshold voltage, and variation). In order to obtain the required semiconductor characteristics, it is preferable that the carrier concentration, the impurity concentration, the defect density, the atomic ratio between a metal element and oxygen, the interatomic distance, the density, and the like be set to appropriate values.

For example, high mobility can be obtained relatively easily in the case of using an In—Sn—Zn-based oxide. However, mobility can be increased by reducing the defect density in a bulk also in the case of using an In—Ga—Zn-based oxide.

For example, in the case where the composition of an oxide containing In, Ga, and Zn at the atomic ratio, In:Ga:Zn=a:b:c (a+b+c=1), is in the neighborhood of the composition of an oxide containing In, Ga, and Zn at the atomic ratio, In:Ga:Zn=A:B:C (A+B+C=1), a, b, and c satisfy the following relation: $(a-A)^2+(b-B)^2+(c-C)^2 \leq r^2$, and r may be 0.05, for example. The same applies to other oxides.

An oxide semiconductor film may be in a non-single-crystal state, for example. The non-single-crystal state is, for example, structured by at least one of c-axis aligned crystal (CAAC), polycrystal, microcrystal, and an amorphous part. The density of defect states of an amorphous part is higher than those of microcrystal and CAAC. The density of defect states of microcrystal is higher than that of CAAC. Note that an oxide semiconductor including CAAC is referred to as a CAAC-OS (c-axis aligned crystalline oxide semiconductor).

For example, an oxide semiconductor film may include a CAAC-OS. In the CAAC-OS, for example, c-axes are aligned, and a-axes and/or b-axes are not macroscopically aligned.

For example, an oxide semiconductor film may include microcrystal. Note that an oxide semiconductor including microcrystal is referred to as a microcrystalline oxide semiconductor. A microcrystalline oxide semiconductor film includes microcrystal (also referred to as nanocrystal) with a size greater than or equal to 1 nm and less than 10 nm, for example. Alternatively, a microcrystalline oxide semiconductor film, for example, includes a crystal-amorphous mixed phase structure where crystal parts (each of which is greater than or equal to 1 nm and less than 10 nm) are distributed.

For example, an oxide semiconductor film may include an amorphous part. Note that an oxide semiconductor including an amorphous part is referred to as an amorphous oxide semiconductor. An amorphous oxide semiconductor film, for example, has disordered atomic arrangement and no crystalline component. Alternatively, an amorphous oxide semiconductor film is, for example, absolutely amorphous and has no crystal part.

Note that an oxide semiconductor film may be a mixed film including any of a CAAC-OS, a microcrystalline oxide semiconductor, and an amorphous oxide semiconductor. The mixed film, for example, includes a region of an amorphous oxide semiconductor, a region of a microcrystalline oxide semiconductor, and a region of a CAAC-OS. Further, the mixed film may have a stacked structure including a region of an amorphous oxide semiconductor, a region of a microcrystalline oxide semiconductor, and a region of a CAAC-OS, for example.

Note that an oxide semiconductor film may be in a single-crystal state, for example.

An oxide semiconductor film preferably includes a plurality of crystal parts. In each of the crystal parts, a c-axis is preferably aligned in a direction parallel to a normal vector of a surface where the oxide semiconductor film is formed or a normal vector of a surface of the oxide semiconductor film. Note that, among crystal parts, the directions of the a-axis and the b-axis of one crystal part may be different from those of another crystal part. An example of such an oxide semiconductor film is a CAAC-OS film.

The CAAC-OS film is not absolutely amorphous. The CAAC-OS film, for example, includes an oxide semiconductor with a crystal-amorphous mixed phase structure where crystal parts and amorphous parts are intermingled. Note that in most cases, the crystal part fits inside a cube whose one side is less than 100 nm. In an image obtained with a transmission electron microscope (TEM), a boundary between an amorphous part and a crystal part and a boundary between crystal parts in the CAAC-OS film are not clearly detected. Further, with the TEM, a grain boundary in the CAAC-OS film is not clearly found. Thus, in the CAAC-OS film, a reduction in electron mobility due to the grain boundary is suppressed.

In each of the crystal parts included in the CAAC-OS film, for example, a c-axis is aligned in a direction parallel to a normal vector of a surface where the CAAC-OS film is formed or a normal vector of a surface of the CAAC-OS film. Further, in each of the crystal parts, metal atoms are arranged in a triangular or hexagonal configuration when seen from the direction perpendicular to the a-b plane, and metal atoms are arranged in a layered manner or metal atoms and oxygen atoms are arranged in a layered manner when seem from the direction perpendicular to the c-axis. Note that, among crystal parts, the directions of the a-axis and the b-axis of one crystal part may be different from those of another crystal part. In this specification, a term "perpendicular" includes a range from 80° to 100°, preferably from 85° to 95°. In addition, a term "parallel" includes a range from −10° to 10°, preferably from −5° to 5°.

In the CAAC-OS film, distribution of crystal parts is not necessarily uniform. For example, in the formation process of the CAAC-OS film, in the case where crystal growth occurs from a surface side of the oxide semiconductor film, the proportion of crystal parts in the vicinity of the surface of the oxide semiconductor film is higher than that in the vicinity of the surface where the oxide semiconductor film is formed in some cases. Further, when an impurity is added to the CAAC-OS film, the crystal part in a region to which the impurity is added becomes amorphous in some cases.

Since the c-axes of the crystal parts included in the CAAC-OS film are aligned in the direction parallel to a normal vector of a surface where the CAAC-OS film is formed or a normal vector of a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that the film deposition is accompanied with the formation of the crystal parts or followed by the formation of the crystal parts through crystallization treatment such as heat treatment. Hence, the c-axes of the crystal parts are aligned in the direction parallel to a normal vector of the surface where the CAAC-OS film is formed or a normal vector of the surface of the CAAC-OS film.

In a transistor using the CAAC-OS film, change in electric characteristics due to irradiation with visible light or ultraviolet light is small. Thus, the transistor has high reliability.

Note that part of oxygen included in the oxide semiconductor film may be substituted with nitrogen.

In an oxide semiconductor having a crystal part such as the CAAC-OS, defects in the bulk can be further reduced and when the surface flatness of the oxide semiconductor is improved, mobility higher than that of an oxide semiconductor in an amorphous state can be obtained. In order to improve the surface flatness, the oxide semiconductor is preferably formed over a flat surface. Specifically, the oxide semiconductor may be formed over a surface with the average surface roughness (Ra) of less than or equal to 1 nm, preferably less than or equal to 0.3 nm, more preferably less than or equal to 0.1 nm. Note that $R_a$ is obtained by expanding, into three dimensions, arithmetic mean surface roughness that is defined by JIS B 0601: 2001 (ISO4287:1997) so as to be applicable to a curved surface. $R_a$ can be expressed as an "average value of the absolute values of deviations from a reference surface to a designated surface" and is defined by the following formula.

$$Ra = \frac{1}{S_0} \int_{y_1}^{y_2} \int_{x_1}^{x_2} |f(x, y) - Z_0| dx dy \qquad \text{[Formula 1]}$$

Here, the specific surface is a surface which is a target of roughness measurement, and is a quadrilateral region which is specified by four points represented by the coordinates $(x_1, y_1, f(x_1, y_1))$, $(x_1, y_2, f(x_1, y_2))$, $f(x_2, y_1, f(x_2, y_1))$, and $(x_2, y_2, f(x_2, y_2))$. $S_0$ represents the area of a rectangle which is obtained by projecting the specific surface on the xy plane, and $Z_0$ represents the height of the reference surface (the average height of the specific surface). Ra can be measured using an atomic force microscope (AFM).

The oxide semiconductor film 403 has a thickness greater than or equal to 1 nm and less than or equal to 30 nm (preferably greater than or equal to 5 nm and less than or equal to 10 nm) and can be formed by a sputtering method, a molecular beam epitaxy (MBE) method, a CVD method, a pulse laser deposition method, an atomic layer deposition (ALD) method, or the like as appropriate. The oxide semiconductor film 403 may be formed with a sputtering apparatus which performs deposition in the state where top surfaces of a plurality of substrates are substantially perpendicular to a top surface of a sputtering target. For example, the CAAC-OS film is formed by a sputtering method with a polycrystalline oxide semiconductor sputtering target. When ions collide with the sputtering target, a crystal region included in the sputtering target may be separated from the target along an a-b plane; in other words, a sputtered particle having a plane parallel to an a-b plane (flat-plate-like sputtered particle or pellet-like sputtered particle) may flake off from the sputtering target. In that case, the flat-plate-like sputtered particle reaches a substrate while maintaining their crystal state, whereby the CAAC-OS film can be formed.

For the deposition of the CAAC-OS film, the following conditions are preferably used.

By reducing the amount of impurities entering the CAAC-OS film during the deposition, the crystal state can be prevented from being broken by the impurities. For example, the concentration of impurities (e.g., hydrogen, water, carbon dioxide, or nitrogen) which exist in the deposition chamber may be reduced. Furthermore, the concentration of impurities in a deposition gas may be reduced. Specifically, a deposition gas whose dew point is −80° C. or lower, preferably −100° C. or lower is used.

By increasing the substrate heating temperature during the deposition, migration of a sputtered particle is likely to occur after the sputtered particle reaches the substrate. Specifically, the substrate heating temperature during the deposition is higher than or equal to 100° C. and lower than or equal to 740° C., preferably higher than or equal to 200° C. and lower than or equal to 500° C. By increasing the substrate heating temperature during the deposition, when the flat-plate-like sputtered particle reaches the substrate, migration occurs on the substrate surface, so that a flat plane of the flat-plate-like sputtered particle is attached to the substrate.

Furthermore, it is preferable that the proportion of oxygen in the deposition gas be increased and the power be optimized in order to reduce plasma damage at the deposition. The proportion of oxygen in the deposition gas is 30 vol % or higher, preferably 100 vol %.

As an example of the sputtering target, an In—Ga—Zn—O compound target is described below.

The In—Ga—Zn—O compound target, which is polycrystalline, is made by mixing $InO_X$ powder, $GaO_Y$ powder, and $ZnO_Z$ powder in a predetermined molar ratio, applying pressure, and performing heat treatment at a temperature higher than or equal to 1000° C. and lower than or equal to 1500° C. Note that X, Y, and Z are each a given positive number. Here, the predetermined molar ratio of $InO_X$ powder to $GaO_Y$ powder and $ZnO_Z$ powder is, for example, 2:2:1, 8:4:3, 3:1:1, 1:1:1, 4:2:3, or 3:1:2. The kinds of powder and the molar ratio for mixing powder may be determined as appropriate depending on the desired sputtering target.

Note that the oxide semiconductor film 403 may have a structure in which a plurality of oxide semiconductor layers is stacked. For example, the oxide semiconductor film 403 may have a stacked-layer structure of a first oxide semiconductor layer and a second oxide semiconductor layer which are formed using metal oxides with different compositions. For example, the first oxide semiconductor layer may be formed using a three-component metal oxide, and the second oxide semiconductor layer may be formed using a two-component metal oxide. Alternatively, for example, both the first oxide semiconductor layer and the second oxide semiconductor layer may be formed using a three-component metal oxide. Further, the constituent elements of the first oxide semiconductor layer and the second oxide semiconductor layer are made to be the same and the composition of the constituent elements of the first oxide semiconductor layer and the second oxide semiconductor layer may be made to be different. For example, the first oxide semiconductor layer may have an atomic ratio of In:Ga:Zn=1:1:1, and the second oxide semiconductor layer may have an atomic ratio of In:Ga:Zn=3:1:2. Alternatively, the first oxide semiconductor layer may have an atomic ratio of In:Ga:Zn=1:3:1, and the second oxide semiconductor layer may have an atomic ratio of In:Ga:Zn=2:1:3. At this time, one of the first oxide semiconductor layer and the second oxide semiconductor layer, which is closer to the gate electrode (on a channel side) preferably contains In and Ga at a proportion of In>Ga. The other which is farther from the gate electrode (on a back channel side) preferably contains In and Ga at a proportion of In Ga.

In an oxide semiconductor, the s orbital of heavy metal mainly contributes to carrier transfer, and when the In content in the oxide semiconductor is increased, overlap of the s orbital is likely to be increased. Therefore, an oxide having a composition of In>Ga has higher mobility than an oxide having a composition of In≤Ga. Further, in Ga, the formation energy of oxygen vacancies is larger and thus oxygen vacancies is less likely to occur, than in In; therefore, the oxide having a composition of In≤Ga has more stable characteristics than the oxide having a composition of In>Ga. An oxide semiconductor containing In and Ga at a proportion of In>Ga is used on a channel side, and an oxide semiconductor containing In and Ga at a proportion of In≤Ga is used on a back channel side; so that field-effect mobility and reliability of a transistor can be further improved.

Alternatively, the first oxide semiconductor layer and the second oxide semiconductor layer may be formed using oxide semiconductors having different crystallinity. That is, the oxide semiconductor may be formed by combining a single crystal oxide semiconductor, a polycrystalline oxide semiconductor, an amorphous oxide semiconductor, and a CAAC-OS as appropriate. When an amorphous oxide semiconductor is applied to at least one of the first oxide semiconductor layer and the second oxide semiconductor layer, internal stress or external stress of the oxide semiconductor film 403 is relieved, variation in characteristics of a transistor is reduced, and reliability of the transistor can be further improved.

On the other hand, an amorphous oxide semiconductor is likely to absorb impurities such as hydrogen which serves as donors, and is likely to be n-type because oxygen vacancies are easily caused. Thus, the oxide semiconductor layer on the channel side is preferably formed using a crystalline oxide semiconductor such as a CAAC-OS.

Further, the oxide semiconductor film 403 may have a stacked-layer structure including three or more layers in which an amorphous oxide semiconductor layer is interposed between a plurality of oxide semiconductor layers having a crystallinity. Alternatively, a structure in which an oxide semiconductor layer having a crystallinity and an amorphous oxide semiconductor film are alternately stacked may be employed.

These two structures used so that the oxide semiconductor film 403 has a stacked-layer structure including a plurality of layers can be combined as appropriate.

An example of a method for manufacturing a semiconductor device including the transistor 440a is described with reference to FIGS. 2A to 2F.

First, the oxide insulating film 436 is formed over the substrate 400 having an insulating surface.

There is no particular limitation on a substrate that can be used as the substrate 400 having an insulating surface as long as it has heat resistance enough to withstand heat treatment performed later. For example, a glass substrate of barium borosilicate glass, aluminoborosilicate glass, or the like, a ceramic substrate, a quartz substrate, or a sapphire substrate can be used. A single crystal semiconductor substrate or a polycrystalline semiconductor substrate of silicon, silicon carbide, or the like; a compound semiconductor substrate of silicon germanium or the like; an SOI substrate; or the like can be used as the substrate 400, or the substrate provided with a semiconductor element can be used as the substrate 400.

The semiconductor device may be manufactured using a flexible substrate as the substrate 400. To manufacture a flexible semiconductor device, the transistor 440a including the oxide semiconductor film 403 may be directly formed over a flexible substrate; or alternatively, the transistor 440a including the oxide semiconductor film 403 may be formed over a substrate, and then may be separated and transferred to a flexible substrate. To separate the transistor 440a from the substrate and transfer to the flexible substrate, a separation layer may be provided between the substrate and the transistor 440a including the oxide semiconductor film.

The oxide insulating film 436 can be formed by a plasma CVD method, a sputtering method, or the like, using silicon oxide, silicon oxynitride, aluminum oxide, aluminum oxynitride, hafnium oxide, gallium oxide, or a mixed material of any of these materials.

The oxide insulating film 436 may have either a single-layer structure or a stacked-layer structure. For example, a silicon oxide film, an In—Hf—Zn-based oxide film, and the oxide semiconductor film 403 may be stacked in that order over the substrate 400; a silicon oxide film, an In—Zr—Zn-based oxide film with an atomic ratio of In:Zr:Zn=1:1:1, and the oxide semiconductor film 403 may be stacked in that order over the substrate 400; or a silicon oxide film, an In—Gd—Zn-based oxide film with an atomic ratio of In:Gd:Zn=1:1:1, and the oxide semiconductor film 403 may be stacked in that order over the substrate 400.

In this embodiment, a silicon oxide film formed by a sputtering method as the oxide insulating film 436 is used.

Further, a nitride insulating film may be provided between the oxide insulating film 436 and the substrate 400. The nitride insulating film can be formed by a plasma CVD method, a sputtering method, or the like with the use of silicon nitride, silicon nitride oxide, aluminum nitride, or aluminum nitride oxide, or a mixed material of any of these materials.

The oxide insulating film 436, which is in contact with the oxide semiconductor film 403, preferably contains an amount of oxygen which exceeds at least the amount of oxygen in the stoichiometric composition in the film (the bulk). For example, in the case where a silicon oxide film is used as the oxide insulating film 436, the composition formula is $SiO_{2+\alpha}$ ($\alpha$>0). By using the oxide insulating film 436 described above, oxygen can be supplied to the oxide semiconductor film 403 and favorable characteristics can be obtained. By supply of oxygen to the oxide semiconductor film 403, oxygen vacancies in the film can be compensated.

For example, when the oxide insulating film 436 containing much (excess) oxygen, which serves as an oxygen supply source, is provided to be in contact with the oxide semiconductor film 403, oxygen can be supplied from the oxide insulating film 436 to the oxide semiconductor film 403. The oxide semiconductor film 403 and the oxide insulating film 436 may be subjected to heat treatment in a state where the oxide semiconductor film 403 and the oxide insulating film 436 are at least partly in contact with each other so that oxygen is supplied to the oxide semiconductor film 403.

Planarization treatment may be performed on a region of the oxide insulating film 436 which is in contact with the oxide semiconductor film 403. The planarization treatment may be, but not particularly limited to, a polishing treatment (such as chemical mechanical polishing (CMP)), a dry etching treatment, or a plasma treatment.

As plasma treatment, reverse sputtering in which an argon gas is introduced and plasma is generated can be performed. The reverse sputtering is a method in which voltage is applied to a substrate side with use of an RF power source in an argon atmosphere and plasma is generated in the vicinity of the substrate so that a substrate surface is modified. Note that instead of an argon atmosphere, a nitrogen atmosphere, a helium atmosphere, an oxygen atmosphere, or the like may be used. The reverse sputtering can remove particle substances (also referred to as particles or dust) attached to the surface of the oxide insulating film 436.

As the planarization treatment, polishing treatment, dry etching treatment, or plasma treatment may be performed plural times, or these treatments may be performed in combination. In the case where the treatments are combined, the order of steps is not particularly limited and may be set as appropriate in accordance with unevenness of the surface of the oxide insulating film 436.

Planarization treatment may be performed on a surface of the silicon oxide film used as the oxide insulating film 436 by a chemical mechanical polishing method (the polishing conditions: a polyurethane-based polishing cloth, silica-based slurry, a slurry temperature of room temperature, a polishing pressure of 0.001 MPa, a rotation number in polishing (table/spindle) of 60 rpm/56 rpm, and a polishing time of 0.5 minutes) so that the average surface roughness (Ra) of the surface of the silicon oxide film is preferably approximately 0.15 nm.

Next, the oxide semiconductor film 403 is formed over the oxide insulating film 436.

In order that hydrogen or water is not contained in the oxide semiconductor film 403 as much as possible in the formation process of the oxide semiconductor film 403, it is preferable to preheat the substrate provided with the oxide insulating film 436 in a preheating chamber in a sputtering apparatus as a pretreatment for deposition of the oxide semiconductor film 403 so that impurities such as hydrogen and moisture adsorbed to the substrate and the oxide insulating film 436 are eliminated and evacuated. As an exhaustion unit provided in the preheating chamber, a cryopump is preferable.

In order to reduce impurities such as hydrogen including water and a hydroxyl group and make the oxide insulating film 436 an oxygen-excess film, heat treatment (dehydration or dehydrogenation) to remove hydrogen including water and a hydroxyl group and/or oxygen doping treatment may be performed on the oxide insulating film 436. The dehydration or dehydrogenation and the oxygen doping treatment each may be performed plural times, and may be combined and repeated.

The oxide semiconductor film 403 immediately after being formed is preferably in a supersaturated state where the amount of oxygen exceeds the amount of oxygen in the stoichiometric composition. For example, in the case where the oxide semiconductor film 403 is formed by a sputtering method, deposition is preferably performed under such a condition that the ratio of oxygen to a deposition gas is high. In particular, deposition is preferably performed in an oxygen atmosphere (100% oxygen gas). The deposition under the condition where the proportion of oxygen in a deposition gas is large, in particular, in an atmosphere containing an oxygen gas at 100% can reduce release of Zn from the film even when the deposition temperature is, for example, higher than or equal to 300° C.

In addition, the oxide semiconductor film 403 is supersaturated with oxygen by being supplied with enough oxygen; thus, the insulating films in contact with the oxide semiconductor film 403 (the plurality of insulating films provided so as to surround the oxide semiconductor film 403) preferably contain excess oxygen.

Note that in this embodiment, a target used for forming the oxide semiconductor film 403 by a sputtering method is, for example, an oxide target having a composition of In:Ga:Zn=3:1:2 [atomic ratio], so that an In—Ga—Zn-based oxide film (IGZO film) is formed.

The relative density (the fill rate) of the metal oxide target is greater than or equal to 90% and less than or equal to 100%, preferably greater than or equal to 95% and less than or equal to 99.9%. By using the metal oxide target with high relative density, a dense oxide semiconductor film can be formed.

It is preferable that a high-purity gas from which impurities such as hydrogen, water, a hydroxyl group, or hydride are removed be used as a sputtering gas for the formation of the oxide semiconductor film 403.

The substrate is held in a deposition chamber kept under reduced pressure. Then, a sputtering gas in which impurities such as hydrogen and moisture are sufficiently removed is introduced into the deposition chamber from which remaining moisture is being removed, and the oxide semiconductor film 403 is formed over the substrate 400 with the use of the target. In order to remove moisture remaining in the deposition chamber, an entrapment vacuum pump such as a cryopump, an ion pump, or a titanium sublimation pump is preferably used. As an exhaustion unit, a turbo molecular pump to which a cold trap is added may be used. In the deposition chamber which is evacuated with the cryopump, for example, a hydrogen atom, a compound containing a hydrogen atom, such as water ($H_2O$), (further preferably, also a compound containing a carbon atom), and the like are removed, whereby the concentration of impurities in the oxide semiconductor film 403 formed in the deposition chamber can be reduced.

The oxide insulating film 436 and the oxide semiconductor film 403 are preferably formed in succession without exposure to the air. According to successive formation of the oxide insulating film 436 and the oxide semiconductor film 403 without exposure to the air, impurities such as hydrogen and moisture can be prevented from being adsorbed onto the surface of the oxide insulating film 436.

The oxide semiconductor film 403 can be formed by processing a film-shaped oxide semiconductor film into an island shape by a photolithography process.

A resist mask for forming the island-shaped oxide semiconductor film 403 may be formed by an inkjet method. Formation of the resist mask by an inkjet method needs no photomask; thus, manufacturing cost can be reduced.

Note that the etching of the oxide semiconductor film may be dry etching, wet etching, or both dry etching and wet etching. As an etchant used for wet etching of the oxide semiconductor film, for example, a mixed solution of phosphoric acid, acetic acid, and nitric acid, or the like can be used. Alternatively, ITO-07N (produced by KANTO CHEMICAL CO., INC.) may be used. Further alternatively, the oxide semiconductor film may be etched by a dry etching method using an inductively coupled plasma (ICP) etching method. For example, an IGZO film is etched by the ICP etching method (the etching conditions: an etching gas of $BCL_3$ and $Cl_2$ ($BCL_3$: $Cl_2$=60 sccm: 20 sccm), a power of 450 W, a bias power of 100 W, and a pressure of 1.9 Pa), so that the IGZO film is processed into an island shape.

It is preferable that the oxide semiconductor film 403 be highly purified to contain few impurities such as copper, aluminum, and chlorine. In the process for manufacturing the transistor 440a, steps in which these impurities are not mixed or attached to the surface of the oxide semiconductor film 403 are preferably selected as appropriate. In the case where the impurities are attached to the surface of the oxide semiconductor film 403, the impurities on the surface of the oxide semiconductor film 403 are preferably removed by exposure to oxalic acid or dilute hydrofluoric acid or plasma treatment (such as $N_2O$ plasma treatment). Specifically, the concentration of copper in the oxide semiconductor film 403 is lower than or equal to $1\times10^{18}$ atoms/cm$^3$, preferably lower than or equal to $1\times10^{17}$ atoms/cm$^3$. Further, the concentration of aluminum in the oxide semiconductor film 403 is lower than or equal to $1\times10^{18}$ atoms/cm$^3$. Further, the concentration of chlorine in the oxide semiconductor film 403 is lower than or equal to $2\times10^{18}$ atoms/cm$^3$.

Further, heat treatment may be performed on the oxide semiconductor film 403 in order to remove excess hydrogen (including water and a hydroxyl group) (to perform dehydration or dehydrogenation treatment). The temperature of the heat treatment is higher than or equal to 300° C. and lower than or equal to 700° C., or lower than the strain point of the substrate. The heat treatment can be performed under reduced pressure, a nitrogen atmosphere, or the like. For example, the substrate is put in an electric furnace which is one of heat treatment apparatuses, and the oxide semiconductor film 403 is subjected to heat treatment at 450° C. for one hour in a nitrogen atmosphere.

Further, a heat treatment apparatus used is not limited to an electric furnace, and a device for heating an object to be processed by heat conduction or heat radiation from a heating element such as a resistance heating element may be alternatively used. For example, an RTA (rapid thermal anneal) apparatus such as a GRTA (gas rapid thermal anneal) apparatus or an LRTA (lamp rapid thermal anneal) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high-temperature gas. As the high-temperature gas, an inert gas which does not react with an object to be processed by heat treatment, such as nitrogen or a rare gas like argon, is used.

For example, as the heat treatment, GRTA may be performed as follows. The substrate is put in an inert gas heated at high temperature of 650° C. to 700° C., is heated for several minutes, and is taken out of the inert gas.

Note that in heat treatment, it is preferable that moisture, hydrogen, and the like be not contained in nitrogen or a rare gas such as helium, neon, or argon. The purity of nitrogen or the rare gas such as helium, neon, or argon which is introduced into the heat treatment apparatus is set to preferably 6N (99.9999%) or higher, more preferably 7N (99.99999%) or higher (that is, the impurity concentration is preferably 1 ppm or lower, more preferably 0.1 ppm or lower).

In addition, after the oxide semiconductor film 403 is heated by the heat treatment, a high-purity oxygen gas, a high-purity dinitrogen monoxide gas, or ultra dry air (the moisture amount is less than or equal to 20 ppm (−55° C. by conversion into a dew point), preferably less than or equal to 1 ppm, or further preferably less than or equal to 10 ppb, in the case where measurement is performed with use of a dew point meter of a cavity ring down laser spectroscopy (CRDS) system) may be introduced into the same furnace. It is preferable that water, hydrogen, or the like be not contained in the oxygen gas or the dinitrogen monoxide gas. Alternatively, the purity of the oxygen gas or the dinitrogen monoxide gas which is introduced into the heat treatment apparatus is preferably 6N or higher, further preferably 7N or higher (i.e., the impurity concentration in the oxygen gas or the dinitrogen monoxide gas is preferably 1 ppm or lower, further preferably 0.1 ppm or lower). The oxygen gas or the dinitrogen monoxide gas acts to supply oxygen that is a main constituent material of the oxide semiconductor and that is reduced by the step for removing impurities for dehydration or dehydrogenation, so that the oxide semiconductor film 403 can be a highly-purified, i-type (intrinsic) oxide semiconductor film.

The heat treatment for dehydration or dehydrogenation may be performed after a film-shaped oxide semiconductor film is formed or after the island-shaped oxide semiconductor film 403 is formed.

The heat treatment for dehydration or dehydrogenation may be performed plural times and may be combined with another heat treatment.

When the heat treatment for dehydration or dehydrogenation is performed in the state where the oxide insulating film 436 is covered with the film-shaped oxide semiconductor film which has not been processed into the island-shaped oxide semiconductor film 403, oxygen contained in the oxide insulating film 436 can be prevented from being released by the heat treatment, which is preferable.

The oxide semiconductor film 403 is preferably purified by sufficient removal of impurities such as hydrogen or by supersaturation with oxygen by sufficient supply of oxygen. Specifically, the hydrogen concentration in the oxide semiconductor film 403 is $5 \times 10^{19}$ atoms/cm$^3$ or lower, preferably $5 \times 10^{18}$ atoms/cm$^3$ or lower, more preferably $5 \times 10^{17}$ atoms/cm$^3$ or lower. Note that the hydrogen concentration in the oxide semiconductor film 403 is measured by secondary ion mass spectrometry (SIMS).

Further, it is preferable that impurities such as hydrogen be sufficiently removed from the insulating films (the oxide insulating film 436, the gate insulating film 402, and the insulating film 407) in contact with the oxide semiconductor film 403. Specifically, hydrogen concentration in the insulating films in contact with the oxide semiconductor film 403 is preferably lower than $7.2 \times 10^{20}$ atoms/cm$^3$.

By removing hydrogen or moisture from the oxide semiconductor to highly purify the oxide semiconductor so as not to contain impurities as much as possible, and supplying oxygen to repair oxygen vacancies therein, the oxide semiconductor can be turned into an i-type (intrinsic) oxide semiconductor or a substantially i-type (intrinsic) oxide semiconductor. This enables the Fermi level ($E_f$) of the oxide semiconductor to be at the same level as the intrinsic Fermi level ($E_i$) thereof. Accordingly, by using the oxide semiconductor film for a transistor, fluctuation in the threshold voltage $V_{th}$ of the transistor due to an oxygen vacancy and a shift of the threshold voltage $\Delta V_{th}$ can be reduced.

Next, a gate insulating film 442 covering the oxide semiconductor film 403 is formed.

To improve the coverage with the gate insulating film 442, the above-described planarization treatment may be performed also on the surface of the oxide semiconductor film 403. It is preferable that the flatness of the surface of the oxide semiconductor film 403 be good particularly when the thickness of the gate insulating film 442 is small.

The gate insulating film 442 has a thickness greater than or equal to 1 nm and less than or equal to 20 nm and can be formed by a sputtering method, an MBE method, a CVD method, a pulse laser deposition method, an ALD method, or the like as appropriate. The gate insulating film 442 may also be formed with a sputtering apparatus which performs film formation in the state where surfaces of a plurality of substrates are substantially perpendicular to a surface of a sputtering target.

As the material of the gate insulating film 442, silicon oxide, gallium oxide, aluminum oxide, silicon nitride, silicon oxynitride, aluminum oxynitride, silicon nitride oxide, or the like can be used. It is preferable that the gate insulating film 442 include oxygen in a portion which is in contact with the oxide semiconductor film 403. In particular, the gate insulating film 442 preferably contains an amount of oxygen which exceeds at least the amount of oxygen in the stoichiometric composition in the film (bulk). For example, in the case where a silicon oxide film is used as the gate insulating film 442, the composition formula is $SiO_{2+\alpha}$ ($\alpha > 0$). In this embodiment, a silicon oxide film of $SiO_{2+\alpha}$ ($\alpha > 0$) is used as the gate insulating film 442. By using the silicon oxide film as the gate insulating film 442, oxygen can be supplied to the oxide semiconductor film 403, leading to good characteristics. Further, the gate insulating film 442 is preferably formed in consideration of the size of a transistor to be formed and the step coverage with the gate insulating film 442.

When the gate insulating film 442 is formed using a high-k material such as hafnium oxide, yttrium oxide, hafnium silicate ($HfSi_xO_y$ (x>0, y>0)), hafnium silicate ($HfSi_xO_y$ (x>0, y>0)) to which nitrogen is added, hafnium aluminate ($HfAl_xO_y$ (x>0, y>0)), or lanthanum oxide, gate leakage current can be reduced. Further, the gate insulating film 442 has either a single-layer structure or a stacked-layer structure.

In order to reduce impurities such as hydrogen including water and a hydroxyl group and make the gate insulating film 442 an oxygen-excess film, heat treatment (dehydration or dehydrogenation) to remove hydrogen including water and a hydroxyl group and/or oxygen doping treatment may be performed on the gate insulating film 442. The dehydration or dehydrogenation and the oxygen doping treatment each may be performed plural times, and may be combined and repeated.

In this embodiment, the gate insulating film 442 may be subjected to oxygen plasma treatment with microwaves while being heated at a temperature greater than or equal to 200° C. and less than or equal to 400° C. By this treatment, the gate insulating film 442 has a high density, and dehydration or dehydrogenation and the oxygen doping treatment can be performed on the gate insulating film 442.

Next, a stacked layer of the conductive film and the insulating film is formed over the gate insulating film 442 and is etched, so that a stacked layer of the gate electrode layer 401 and the insulating film 413 are formed.

The gate electrode layer 401 can be formed using a metal material such as molybdenum, titanium, tantalum, tungsten, aluminum, copper, chromium, neodymium, or scandium or an alloy material which contains any of these materials as its main component. A semiconductor film which is doped with an impurity element such as phosphorus and is typified by a polycrystalline silicon film, or a silicide film of nickel silicide or the like can also be used as the gate electrode layer 401. The gate electrode layer 401 has either a single-layer structure or a stacked-layer structure.

The gate electrode layer 401 can be formed using a conductive material such as indium oxide-tin oxide, indium oxide containing tungsten oxide, indium zinc oxide containing tungsten oxide, indium oxide containing titanium oxide, indium tin oxide containing titanium oxide, indium oxide-zinc oxide, or indium tin oxide to which silicon oxide is added. It is also possible that the gate electrode layer 401 has a stacked-layer structure of the above conductive material and the above metal material.

As one layer of the gate electrode layer 401 which is in contact with the gate insulating film 442, a metal oxide containing nitrogen, specifically, an In—Ga—Zn—O film containing nitrogen, an In—Sn—O film containing nitrogen, an In—Ga—O film containing nitrogen, an In—Zn—O film containing nitrogen, a Sn—O film containing nitrogen, an In—O film containing nitrogen, or a metal nitride (InN, SnN, or the like) film can be used. These films each have a work function of 5 eV or higher, preferably 5.5 eV or higher, which enables the threshold voltage of the transistor to be positive when used as the gate electrode layer, so that a switching element of what is called normally-off type can be achieved.

The insulating film 413 can be formed using an inorganic insulating film such as a silicon nitride film, an aluminum nitride film, a silicon nitride oxide film, an aluminum nitride oxide film, a silicon oxide film, a silicon oxynitride film, an aluminum oxide film, an aluminum oxynitride film. The insulating film 413 can be formed by a plasma CVD method, a sputtering method, or the like.

Figure 2A:
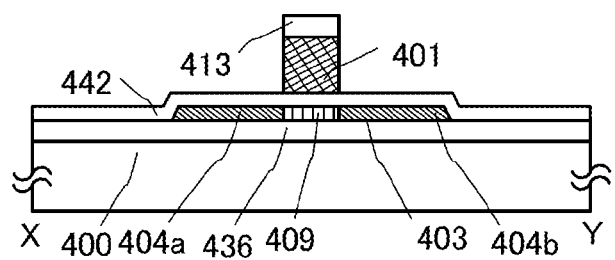
FIGS. 2A to 2F are cross-sectional views illustrating one embodiment of a method for manufacturing a semiconductor device.

Next, a dopant is introduced into the oxide semiconductor film 403 using the gate electrode layer 401 and the insulating film 413 as masks, whereby the low-resistance regions 404a and 404b are formed (see FIG. 2A).

The dopant is an impurity element by which the conductivity of the oxide semiconductor film 403 is changed. One or more selected from the following can be used as the dopant: Group 15 elements (typical examples thereof are phosphorus (P), arsenic (As), and antimony (Sb)), boron (B), aluminum (Al), tungsten (W), molybdenum (Mo), nitrogen (N), argon (Ar), helium (He), neon (Ne), indium (In), gallium (G), fluorine (F), chlorine (Cl), titanium (Ti), and zinc (Zn).

The dopant can be introduced into the oxide semiconductor film 403 through another film (e.g., the gate insulating film 442) by an implantation method. As the method for introducing the dopant, an ion implantation method, an ion doping method, a plasma immersion ion implantation method, or the like can be used. In that case, it is preferable to use a single ion of the dopant, a fluoride ion, or a chloride ion.

The introduction of the dopant may be controlled by setting the introduction conditions such as the accelerated voltage and the dosage, or the thickness of the films through which the dopant passes as appropriate. In this embodiment, phosphorus is used as the dopant, and boron ions are implanted by an ion implantation method. The dosage of the dopants can be set to be greater than or equal to $1 \times 10^{13}$ ions/cm$^2$ and less than or equal to $5 \times 10^{16}$ ions/cm$^2$.

The concentration of the dopant in the low-resistance regions is preferably higher than or equal to $5 \times 10^{18}$/cm$^3$ and lower than or equal to $1 \times 10^{22}$/cm$^3$.

The substrate 400 may be heated in introducing the dopant.

The introduction of the dopant into the oxide semiconductor film 403 may be performed plural times, and plural kinds of dopants may be used.

Heat treatment may be performed thereon after the dopant introduction. The heat treatment is preferably performed at a temperature higher than or equal to 300° C. and lower than or equal to 700° C., further preferably higher than or equal to 300° C. and lower than or equal to 450° C., for one hour under an oxygen atmosphere. The heat treatment may be performed under a nitrogen atmosphere, reduced pressure, or the air (ultra-dry air).

In this embodiment, phosphorus (P) ions are implanted into the oxide semiconductor film 403 by an ion implantation method. Note that the conditions of the phosphorus (P) ion implantation are as follows: the acceleration voltage is 30 kV and the dosage is $1.0 \times 10^{15}$ ions/cm$^2$.

When the oxide semiconductor film 403 is a CAAC-OS film, the oxide semiconductor film 403 is partly made amorphous by introduction of the dopant in some cases.

Thus, the oxide semiconductor film 403 including the low-resistance regions 404a and 404b with the channel formation region 409 provided therebetween is formed.

Figure 2B:
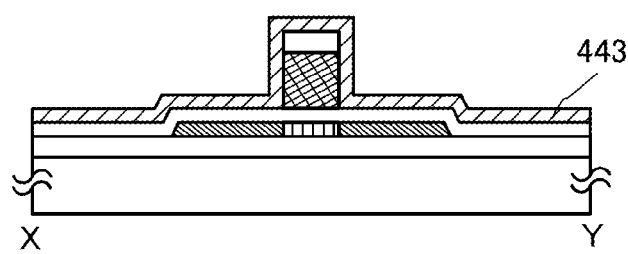

Next, a first insulating film 443 is formed over the gate electrode layer 401 and the insulating film 413 (see FIG. 2B). The first insulating film 443 is formed with a thickness of greater than or equal to 20 nm and less than or equal to 50 nm (preferably greater than or equal to 25 nm and less than or equal to 40 nm).

As the first insulating film 443, a single-layer structure or a stacked-layer structure of one or more inorganic insulating films, typical examples of which include a silicon oxide film, a silicon oxynitride film, an aluminum oxide film, an aluminum oxynitride film, a silicon nitride film, an aluminum nitride film, a silicon nitride oxide film, and an aluminum nitride oxide film can be used. The first insulating film 443 can be formed by a plasma CVD method, a sputtering method, or a CVD method using a deposition gas. As a CVD method, an LPCVD method, a plasma CVD method, or the like can be used, and as another method, a coating film or the like can also be used.

In this embodiment, a silicon oxynitride film with a thickness of 30 nm formed by a plasma CVD method is used as the first insulating film 443.

Next, treatment for introducing oxygen 431 (also referred to as oxygen doping treatment) is performed on the first insulating layer 443. Thus, a first insulating film 444 having an oxygen-excess region is formed (see FIG. 2C).

At least any of an oxygen radical, an oxygen atom, an oxygen molecule, ozone, an oxygen ion (an oxygen molecular ion) and/or an oxygen cluster ion may be included in the oxygen 431.

The introduction of the oxygen 431 to the first insulating film 443 can be performed by an ion implantation method, an ion doping method, a plasma immersion ion implantation method, plasma treatment, or the like, for example. Note that for the ion implantation method, a gas cluster ion beam may be used. The oxygen 431 may be introduced into the entire surface of the substrate 400 at a time. Alternatively, a linear ion beam may be used, for example. In the case of using a linear ion beam, relative movement (scanning) of the substrate or the ion beam enables the oxygen 431 to be introduced into the entire surface of the first insulating layer 443.

As a supply gas of the oxygen 431, a gas containing oxygen (O) can be used; for example, an $O_2$ gas, an $N_2O$ gas, a $CO_2$ gas, a CO gas, or an $NO_2$ gas can be used. Note that a rare gas (e.g., Ar) may be contained in the supply gas of the oxygen.

For example, in the case where oxygen is introduced by an ion implantation method, the dosage of the oxygen 431 is preferably greater than or equal to $1 \times 10^{13}$ ions/cm$^2$ and less than or equal to $5 \times 10^{16}$ ions/cm$^2$, and the content of oxygen in the first insulating layer 444 after the oxygen doping treatment preferably exceeds that of the stoichiometric composition of the first insulating layer 444. Note that such a region containing oxygen in excess of the stoichiometric composition may exist in at least part of the first insulating layer 444. The depth at which oxygen is implanted may be adjusted as appropriate by implantation conditions. Further, the oxygen doping treatment enables the gate insulating film 442 and the oxide semiconductor film 403 which are formed below the first insulating film 443 also to be supplied with oxygen.

Figure 2C:
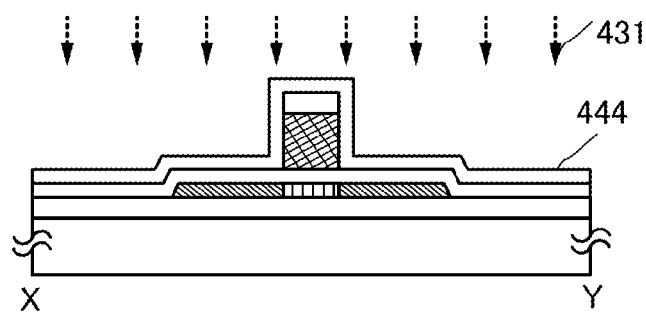
Figure 2D:
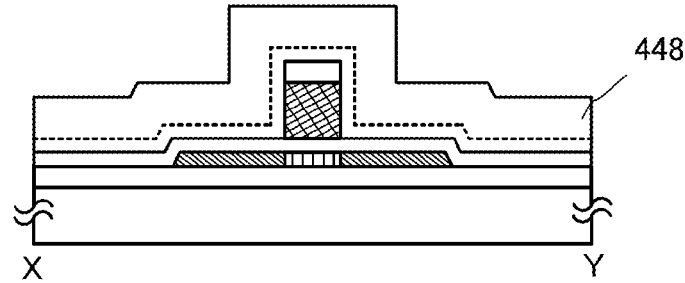

Further, a second insulating film 448 is formed over the first insulating film 444 (see FIG. 2D). The second insulating film 448 can be formed using a material and a method which are similar to those of the first insulating film 443; however, the second insulating film 448 has a larger thickness than the first insulating film 443, and preferably has a thickness of greater than or equal to 200 nm and less than or equal to 500 nm. Further, the second insulating may also be subjected to oxygen doping treatment.

In this embodiment, a silicon oxynitride film with a thickness of 370 nm formed by a plasma CVD method is used as the second insulating film 448.

The first insulating film 444 and the second insulating film 448 are etched so that the sidewall insulating layer is formed in which the first insulating films 412a and 412b and the second insulating films 414a and 414b are stacked. Anisotropic etching is performed as the etching.

The sidewall insulating layer in which the first insulating films 412a and 412b and the second insulating films 414a and 414b are stacked is formed in such a manner that the second insulating film 448 is formed over the first insulating film 444 having an oxygen-excess region and etching is performed thereon; accordingly, the oxygen-excess region can be formed in the sidewall insulating layer.

Figure 2E:
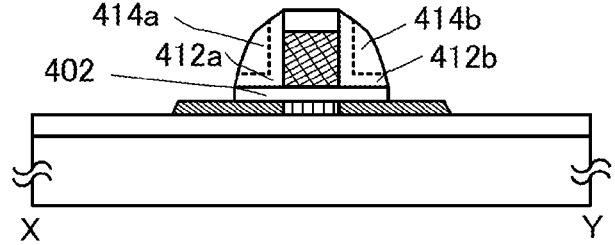

Further, the gate insulating film 442 is etched using the gate electrode layer 401, the insulating film 413, the first insulating films 412a and 412b and the second insulating films 414a and 414b as masks, whereby the gate insulating film 402 is formed (see FIG. 2E).

The sidewall insulating layer filled with excess oxygen in a region adjacent to the oxide semiconductor film 403 and the gate insulating film 442 prevents elimination of oxygen from the oxide semiconductor film 403 and the gate insulating film 442 and effectively serves as an oxygen supplying layer which supplies oxygen to the oxide semiconductor film 403 and the gate insulating film 442.

A dense inorganic insulating film (typically, an aluminum oxide film) that serves as a protective insulating film can be formed over the oxide semiconductor film 403, the gate insulating film 402, and the gate electrode layer 401.

In this embodiment, the insulating layer 407 is formed over the oxide semiconductor film 403, the gate insulating film 402, and the gate electrode layer 401.

The insulating film 407 may have a single-layer structure or a stacked-layer structure and preferably includes at least an aluminum oxide film.

With the aluminum oxide film having a high density (film density higher than or equal to 3.2 g/cm$^3$, preferably higher than or equal to 3.6 g/cm$^3$), the transistor 440a can have stable electric characteristics. The aluminum oxide film preferably contains an amount of oxygen which exceeds at least the amount of oxygen in the stoichiometric composition in the film (bulk). For example, in the case of using the aluminum oxide film, the composition may be AlOx (x>1.5).

An aluminum oxide film which can be used for the insulating film 407 has a superior shielding effect (blocking effect), which is not permeable to either oxygen or impurities such as hydrogen or moisture.

Therefore, during the manufacturing process and after the manufacture, the insulating film 407 serves as a protective film for preventing entry of impurities such as hydrogen and moisture which might cause variation in electric characteristics into the oxide semiconductor film 403 and release of oxygen which is a main component of the oxide semiconductor from the oxide semiconductor film 403. Further, an aluminum oxide film can supply oxygen to the oxide semiconductor film 403 which is in contact with the aluminum oxide film.

The insulating film 407 can be formed by a plasma CVD method, a sputtering method, an evaporation method, or the like. Alternatively, a metal oxide film that is obtained by oxidation treatment of a metal film may be used as the insulating film 407. In this embodiment, an aluminum oxide film obtained by oxygen doping treatment on an aluminum film is used.

As the insulating film 407, an inorganic insulating film such as a silicon oxide film, a silicon oxynitride film, an aluminum oxynitride film, or a gallium oxide film can be typically used as well as the aluminum oxide film. A hafnium oxide film, a magnesium oxide film, a zirconium oxide film, a lanthanum oxide film, a barium oxide film, or a metal nitride film (e.g., an aluminum nitride film) can also be used.

After the formation of the insulating film 407, heat treatment may be performed at a temperature higher than or equal to 300° C. and lower than or equal to 500° C. (e.g., higher than or equal to 400° C. and lower than or equal to 450° C.). The heat treatment enables oxygen included in the oxygen-excess region of the sidewall insulating layer to be diffused into the edge of the oxide semiconductor film 403 and to enter the edge of the oxide semiconductor film 403. Further, the heat treatment enables the oxygen to be diffused also into the gate insulating film 402 and the interface between the oxide semiconductor film 403 and the gate insulating film 402 to be improved. Further, the first insulating films 412a and 412b which are included in the sidewall insulating layer and contain excess oxygen are provided quite near the channel formation region 409 of the oxide semiconductor film 403; thus, the oxygen in the sidewall insulating layer can also be supplied to the channel formation region 409. Accordingly, the oxygen included in the oxygen-excess region of the sidewall insulating layer can be supplied to the oxide semiconductor film 403 and the gate insulating film 402, so that oxygen vacancies can be compensated.

The interlayer insulating film 415 is formed over the insulating film 407. The interlayer insulating film 415 can be formed using a material and a method which are similar to those of the insulating film 407. In this embodiment, the interlayer insulating film 415 is formed to have a thickness enough to level out unevenness produced by the transistor 440a. As the interlayer insulating film 415, a silicon oxynitride film formed by a CVD method or a silicon oxide film formed by a sputtering method can be used.

Further, a planarization insulating film may be formed in order to reduce surface unevenness due to the transistor. As the planarization insulating film, an organic material such as a polyimide-, acrylic-, or benzocyclobutene-based resin can be used. Other than such organic materials, it is also possible to use a low-dielectric constant material (a low-k material) or the like. Note that the planarization insulating film may be formed by stacking a plurality of insulating films formed from these materials.

Openings reaching the oxide semiconductor film 403 are formed in the interlayer insulating film 415 and the insulating film 407, and the source electrode layer 405a and the drain electrode layer 405b are formed. The transistor 440a is connected to another transistor with the use of the source electrode layer 405a and the drain electrode layer 405b, so that a variety of circuits can be formed.

As the conductive film used for the source electrode layer 405a and the drain electrode layer 405b, for example, a metal film containing an element selected from Al, Cr, Cu, Ta, Ti, Mo, and W, or a metal nitride film containing any of the above elements as a component (e.g., a titanium nitride film, a molybdenum nitride film, or a tungsten nitride film) can be used. A metal film having a high melting point such as Ti, Mo, W, or the like or a metal nitride film of any of these elements (a titanium nitride film, a molybdenum nitride film, and a tungsten nitride film) may be stacked on one of or both of a lower side or an upper side of a metal film of Al, Cu, or the like. Alternatively, the conductive film used for the source electrode layer and the drain electrode layer may be formed using a conductive metal oxide. As the conductive metal oxide, indium oxide ($In_2O_3$), tin oxide ($SnO_2$), zinc oxide (ZnO), ITO, indium oxide-tin oxide ($In_2O_3$—$SnO_2$), indium oxide-zinc oxide ($In_2O_3$—ZnO), or any of these metal oxide materials in which silicon oxide is contained can be used.

For example, as the source electrode layer 405a and the drain electrode layer 405b, a single layer of a molybdenum film, a stacked layer of a tantalum nitride film and a copper film, a stacked layer of a tantalum nitride film and a tungsten film, or the like can be used.

Figure 2F:
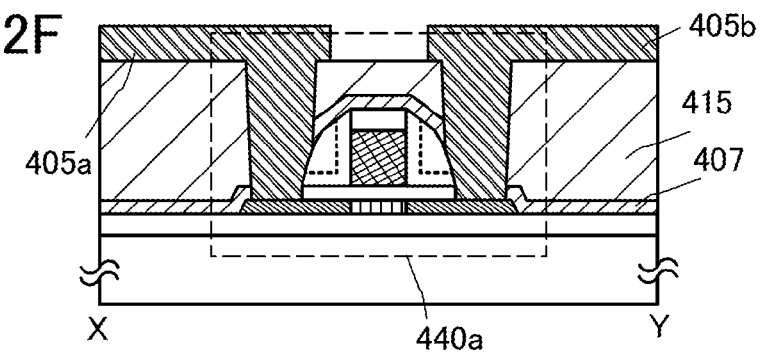

Through the above-described steps, the semiconductor device including the transistor 440a of this embodiment can be formed (see FIG. 2F).

FIGS. 3A to 3D and FIGS. 4A to 4C illustrate examples of transistors 440b, 440c, 440d, 440e, 440f, 440g, and 440h, each of which have a structure different from that of the transistor 440a.

In each of the transistors 440b, 440c, 440d, and 440e, the source electrode layer 405a and the drain electrode layer 405b are provided so as to be in contact with exposed portions of a top surface of the oxide semiconductor film 403 and the sidewall insulating layer (the first insulating films 412a and 412b and the second insulating films 414a and 414b). The distance between the gate electrode layer 401 and a region (contact region) in which the oxide semiconductor film 403 is in contact with the source electrode layer 405a or the drain electrode layer 405b corresponds to a width of the sidewall insulating layer in the channel length direction, whereby the further miniaturization can be achieved and variation in the manufacturing process can be suppressed.

As described above, the distance between the gate electrode layer 401 and the region (contact region) in which the oxide semiconductor film 403 is in contact with the source electrode layer 405a or the drain electrode layer 405b can be short; thus, the resistance between the gate electrode layer 401 and the region (contact region) where the oxide semiconductor film 403 is in contact with the source electrode layer 405a or the drain electrode layer 405b is reduced. As a result, on-state characteristics of the transistors 440b, 440c, 440d, and 440e can be improved.

Figure 3A:
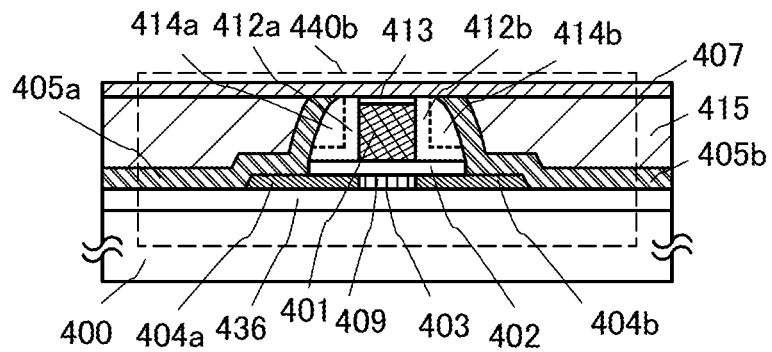
FIGS. 3A to 3D are cross-sectional views each illustrating one embodiment of a semiconductor device.
Figure 3B:
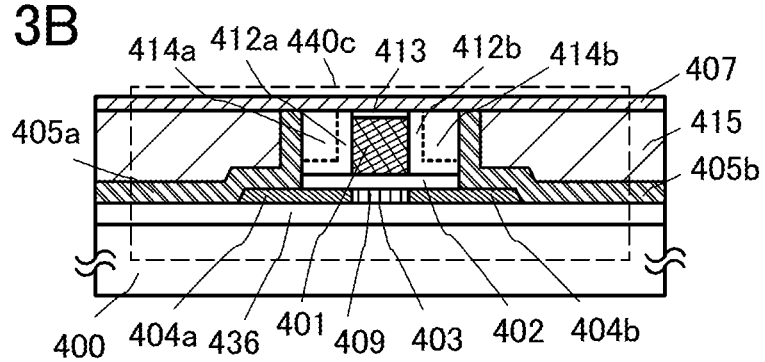
Figure 3C:
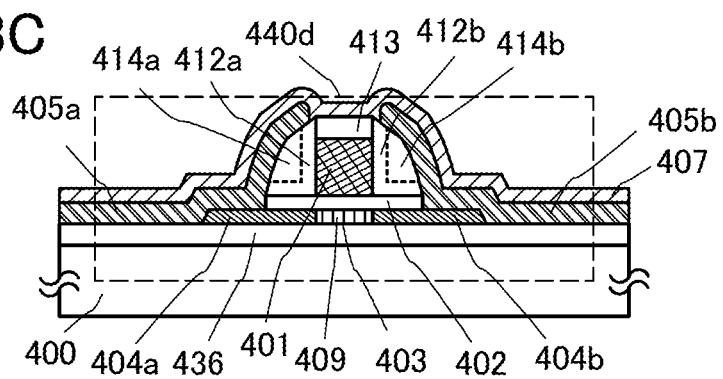
Figure 3D:
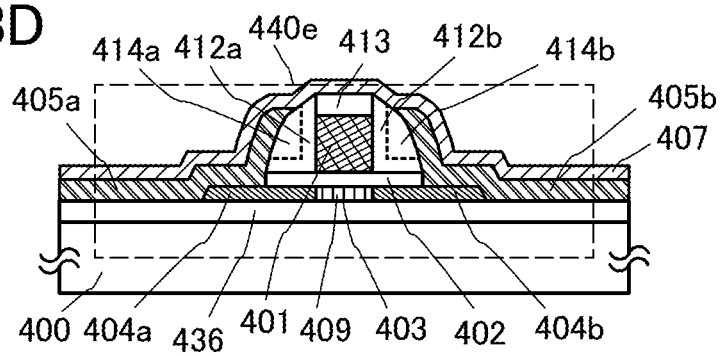

Further, in FIGS. 3A and 3B, the insulating film 407 is provided in contact with the interlayer insulating film 415, the source electrode layer 405a, the drain electrode layer 405b, the sidewall insulating layer (the first insulating films 412a and 412b and the second insulating films 414a and 414b), and the insulating film 413.

In each of the manufacturing processes of the transistors 440b and 440c, the conductive film provided over the gate electrode layer 401, the insulating film 413, the sidewall insulating layer (the first insulating films 412a and 412b and the second insulating films 414a and 414b) is removed by cutting (grinding or polishing), so that the conductive film is divided; thus, the source electrode layer 405a and the drain electrode layer 405b are formed. As the cutting (grinding or polishing) method, a chemical mechanical polishing (CMP) method can be preferably used.

In the manufacturing process of the transistor 440d, the conductive film provided over the gate electrode layer 401, the insulating film 413, and the sidewall insulating layer (the first insulating films 412a and 412b and the second insulating films 414a and 414b) is etched using a resist mask formed by a photolithography process, so that the source electrode layer 405a and the drain electrode layer 405b are formed.

In the manufacturing process of the transistor 440e, the conductive film provided over the gate electrode layer 401, the insulating film 413, and the sidewall insulating layer (the first insulating films 412a and 412b and the second insulating films 414a and 414b) is etched while a resist mask formed by a photolithography process is recessed gradually, so that the source electrode layer 405a and the drain electrode layer 405b are formed.

In the transistor 440f, the source electrode layer 405a and the drain electrode layer 405b are provided in regions which do not overlap with the gate insulating film 402 of the oxide semiconductor film 403. A metal film (an aluminum film, a titanium film, or the like) is formed so as to be in contact with a portion of the oxide semiconductor film 403 which is exposed from the sidewall insulating layer, and a metal element is diffused into the oxide semiconductor film 403 by heat treatment so as to reduce the resistance of the oxide semiconductor film 403, so that the source electrode layer 405a and the drain electrode layer 405b are formed. Note that after the formation of the source electrode layer 405a and the drain electrode layer 405b, the metal film is removed.

In the transistor 440g, the sidewall insulating layer is provided on the sidewall of the gate electrode layer 401, and the source electrode layer 405a and the drain electrode layer 405b are in contact with the side surface of the oxide semiconductor film and are electrically connected to the oxide semiconductor film. The electrical contact region between the source electrode layer 405 and the drain electrode layer 405b and the oxide semiconductor film 403 can be set close to the gate electrode layer 401; thus, it is effective for improvement in on-state characteristics.

Figure 4A:
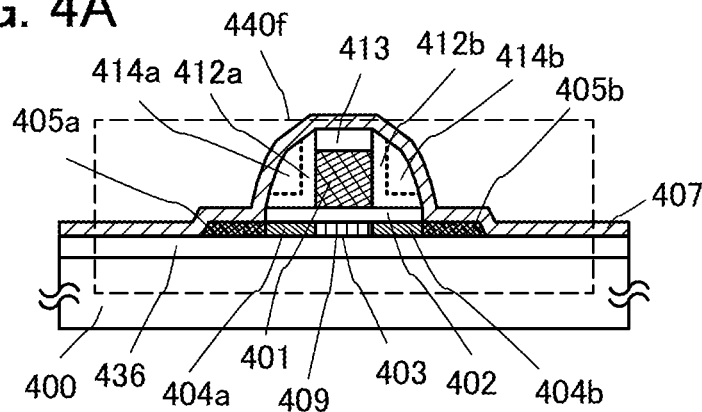
FIGS. 4A to 4C are cross-sectional views each illustrating one embodiment of a semiconductor device.
Figure 4B:
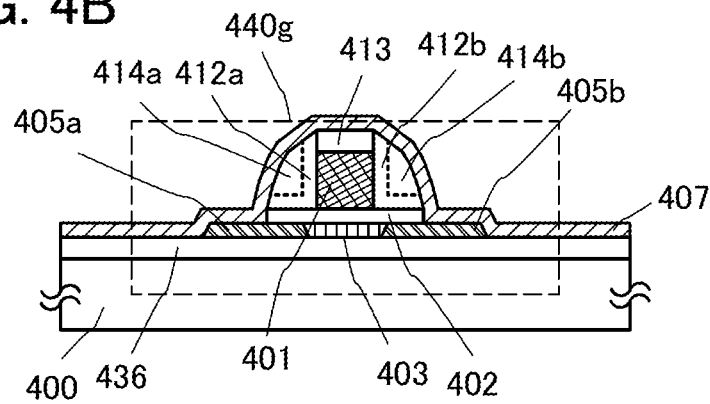
Figure 4C:
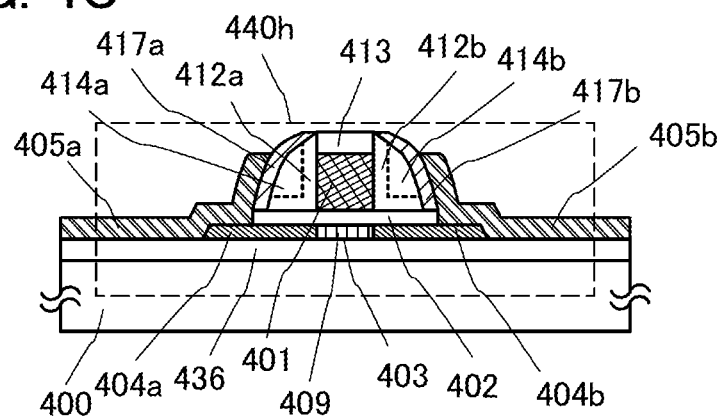

In the transistor 440h, a sidewall insulating layer using an insulating film with a high barrier property is stacked to cover the sidewall insulating layer having an oxygen-excess region. As illustrated in FIG. 4C, after the formation of the sidewall insulating layer formed of the stacked layers of the first insulating films 412a and 412b and the second insulating films 414a and 414b, the insulating film with a high barrier property is formed to cover the sidewall insulating layer and then is subjected to anisotropic etching, so that the insulating films 417a and 417b are formed. The gate insulating film 402 is etched using the first insulating films 412a and 412b, the second insulating films 414a and 414b, and the insulating films 417a and 417b as masks, so that the source electrode layer 405a and the drain electrode layer 405b in contact with the oxide semiconductor film 403 (the low-resistance regions 404a and 404b) and the insulating film films 417a and 417b are formed. By the provision of the insulating films 417a and 417b with a high barrier property, release of oxygen contained in the oxygen-excess region of the first insulating films 412a and 412b and the second insulating films 414a and 414b can be prevented.

As described above, in the semiconductor devices including any of the transistors 440a to 440g using an oxide semiconductor film, stable electric characteristics can be provided and high reliability can be achieved.

A structure of a semiconductor device including a transistor using an oxide semiconductor film, which achieves high-speed response and high-speed operation, and a manufacturing method thereof can be provided.

Embodiment 2

In this embodiment, the oxide semiconductor film 403 is partly made amorphous, and hydrogen is attracted to amorphous regions 445a and 445b from the channel formation region 409 of the oxide semiconductor film so as to be fixed, so that hydrogen in the channel formation region is removed as much as possible.

Note that the steps up to and including the formation of the sidewall insulating layer are the same as those in Embodiment 1; thus, description thereof is omitted here.

Figure 12A:
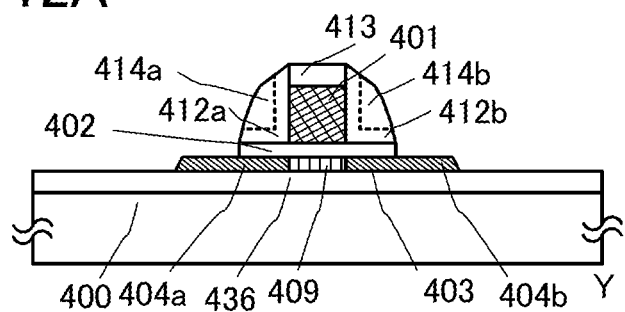
FIGS. 12A to 12C are cross-sectional views illustrating one embodiment of a semiconductor device and a method of manufacturing the semiconductor device.

First, in accordance with Embodiment 1, the same state as that in FIG. 2E is obtained. Note that FIG. 12A is the same as FIG. 2E.

In the case where the oxide semiconductor film 403 is partly made amorphous by the introduction of the dopant illustrated in FIG. 2C, crystallinity is enhanced by heat treatment. For example, by the introduction of the dapant, in a region of the oxide semiconductor film 403, which does not overlap with the gate electrode layer 401, the upper layer becomes amorphous, whereas the lower layer is not doped with the dopant and its crystalline component may be kept held. In the case where the oxide semiconductor film 403 is partly made amorphous as described above, it is preferable that the amorphized region be recrystallized by heat treatment so that crystallinity of the oxide semiconductor film 403 is enhanced. By the heat treatment, the low-resistance regions 404a and 404b are provided with the channel formation region 409 provided therebetween and the oxide semiconductor film 403 with high crystallinity can be obtained.

The dopant is an impurity element by which the conductivity of the oxide semiconductor film 403 is changed. As the dopants, one or more elements selected from a Group 15 element (typically, phosphorus (P), arsenic (As)), and antimony (Sb)), boron (B), aluminum (Al), tungsten (W), molybdenum (Mo), gallium (Ga), nitrogen (N), argon (Ar), helium (He), neon (Ne), indium (In), fluorine (F), chlorine (Cl), titanium (Ti), and zinc (Zn) can be used.

Figure 12B:
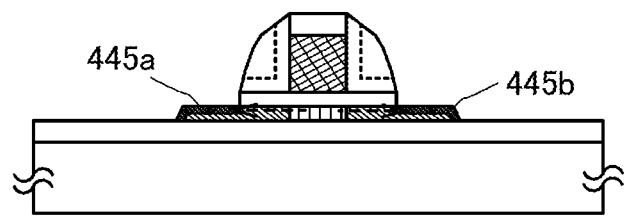

After the same state as that in FIG. 2E is obtained, treatment is performed so that exposed portions of the low-resistance regions 404a and 404b are partly made amorphous. As an example of the treatment for making the exposed portions of the low-resistance regions 404a and 404b amorphous, exposure to argon plasma or oxygen plasma may be performed. Alternatively, plasma including dopant may be performed. In the case where the oxide semiconductor film 403 is sufficiently thicker than the depth from the surface at which oxygen, argon, and dopant are added by the plasma, only surface layers of the exposed portions of the low-resistance regions 404a and 404b form the amorphous regions 440a and 445b and a crystalline component of the other region is kept held (see FIG. 12B). By the provision of the amorphous regions 445a and 445b, hydrogen is attracted to the amorphous regions 445a and 445b in the direction indicated by the dashed-line arrow in FIG. 12B and fixed, so that hydrogen in the channel formation region can be removed as much as possible.

The insulating film 413 and the second insulating films 414a and 414b are important for protecting the gate electrode layer 401 from plasma in the treatment where the exposed portions of the low-resistance regions 404a and 404b are partly made amorphous.

Further, as another treatment method of partly making the exposed portions of the low-resistance regions 404a and 404b amorphous, addition of argon, oxygen, and dopant can be performed with use of an ion implantation apparatus or an ion plasma apparatus.

Next, the insulating film 407 is formed as a dense inorganic insulating film (typically, an aluminum oxide film) that serves as a protective insulating film, over the oxide semiconductor film 403, the gate insulating film 402, and the gate electrode layer 401.

The subsequent steps after and including the formation of the insulating film 407 are the same as those in Embodiment 1; thus, the detailed description is omitted here.

Figure 12C:
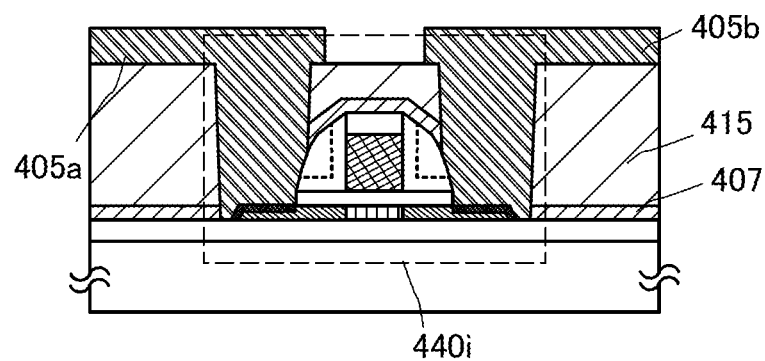

Though the above-described steps, the semiconductor device including the transistor 440i of this embodiment can be formed (see FIG. 12C).

Further, as another treatment method of partly making the exposed portions of the low-resistance regions 404a and 404b amorphous, a formation process in which a conductive film used for the source electrode layer 405a and the drain electrode layer 405b is formed by performing sputtering with high electric power may be employed in order to reduce the number of above-described steps. In this case, the exposed portions of the low-resistance regions 404a and 404b can be partly made amorphous depending on the deposition condition of the conductive film; thus, the oxide semiconductor film can be partly made amorphous without increasing the number of steps.

The structures, methods, and the like described in this embodiment can be combined as appropriate with any of the structures, methods, and the like described in the other embodiments.

Embodiment 3

In this embodiment, an example of a semiconductor device which includes the transistor described in this specification, which can hold stored data even when not powered, and which does not have a limitation on the number of write cycles, will be described with reference to drawings.

Figure 5A:
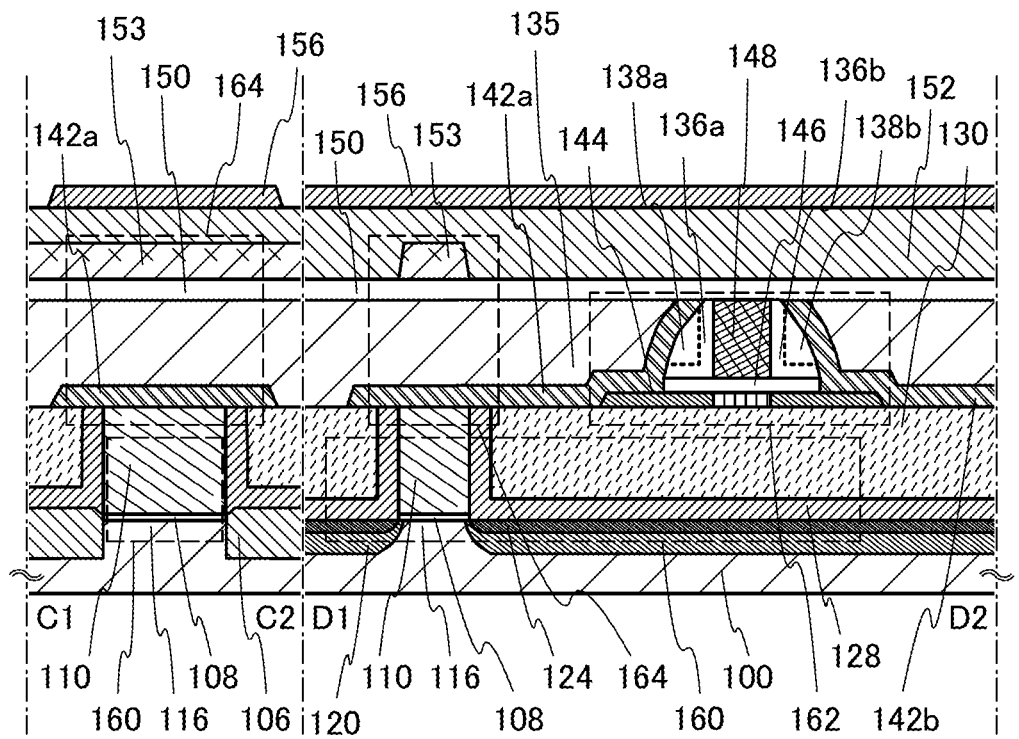
FIGS. 5A to 5C are a cross-sectional view, a plan view, and a circuit diagram which illustrate one embodiment of a semiconductor device.
Figure 5B:
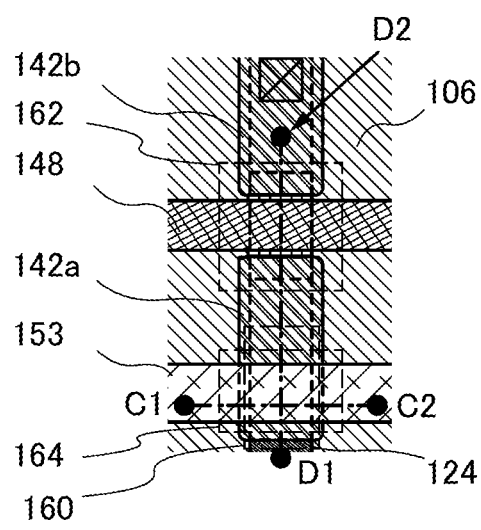
Figure 5C:
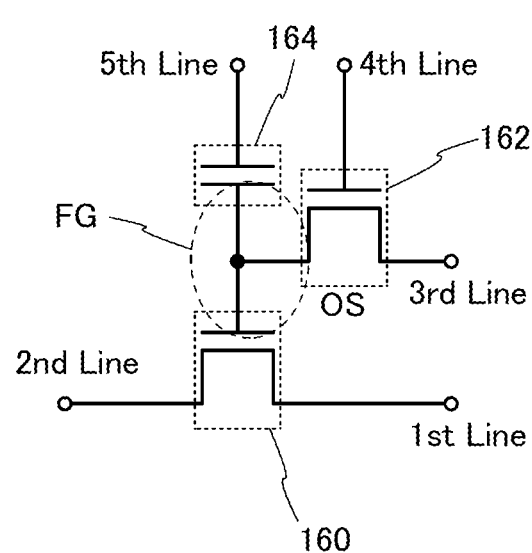

FIGS. 5A and 5B illustrate an example of a structure of a semiconductor device. FIG. 5A is a cross-sectional view of the semiconductor device, FIG. 5B is a plan view of the semiconductor device, and FIG. 5C is a circuit diagram of the semiconductor device. Here, FIG. 5A corresponds to a cross section along line C1-C2 and line D1-D2 in FIG. 5B.

The semiconductor device illustrated in FIGS. 5A and 5B includes a transistor 160 including a first semiconductor material in a lower portion, and a transistor 162 including a second semiconductor material in an upper portion. The transistor 162 has the same structure as the transistor 440b described in Embodiment 1.

Here, the first semiconductor material and the second semiconductor material are preferably materials having different band gaps. For example, the first semiconductor material may be a semiconductor material other than an oxide semiconductor (e.g., silicon) and the second semiconductor material may be an oxide semiconductor. A transistor including a material other than an oxide semiconductor can operate at high speed easily. On the other hand, a transistor including an oxide semiconductor enables charge to be held for a long time owing to its characteristics.

Although all the transistors are n-channel transistors here, it is needless to say that p-channel transistors can be used. The transistor 162 for holding information is not necessarily limited to the transistor formed using an oxide semiconductor, which is described in Embodiment 1. Further, the specific structure of the semiconductor device is not necessarily limited to those described here such as the material used for the semiconductor device and the condition of the semiconductor device.

The transistor 160 in FIG. 5A includes a channel formation region 116 provided in a substrate 100 including a semiconductor material (e.g., silicon), impurity regions 120 provided such that the channel formation region 116 is provided therebetween, intermetallic compound regions 124 in contact with the impurity regions 120, a gate insulating film 108 provided over the channel formation region 116, and a gate electrode 110 provided over the gate insulating film 108. Note that a transistor whose source electrode and drain electrode are not illustrated in a drawing may be referred to as a transistor for the sake of convenience. Further, in such a case, in description of a connection of a transistor, a source region and a source electrode are collectively referred to as a "source electrode," and a drain region and a drain electrode are collectively referred to as a "drain electrode". That is, in this specification, the term "source electrode" may include a source region.

An element isolation insulating layer 106 is provided over the substrate 100 so as to surround the transistor 160. Insulating layers 128 and 130 are provided to cover the transistor 160. Note that, in the transistor 160, the sidewall insulating layer may be formed on the side surface of the gate electrode 110 and the impurity regions 120 may include a region having a different impurity concentration.

The transistor 160 formed using a single crystal semiconductor substrate can operate at high speed. Thus, when the transistor is used as a reading transistor, data can be read at high speed. Two insulating films are formed so as to cover the transistor 160. As treatment prior to formation of the transistor 162 and a capacitor 164, CMP treatment is performed on the two insulating films so that the insulating layer 128 and the insulating layer 130 are formed to be planarized and an upper surface of the gate electrode 110 is exposed.

As each of the insulating layer 128 and the insulating layer 130, typically, it is possible to use an inorganic insulating film such as a silicon oxide film, a silicon oxynitride film, an aluminum oxide film, an aluminum oxynitride film, a silicon nitride film, an aluminum nitride film, a silicon nitride oxide film, or an aluminum nitride oxide film. The insulating layer 128 and the insulating layer 130 can be formed by a plasma CVD method, a sputtering method, or the like.

Alternatively, an organic material such as a polyimide-based resin, an acrylic-based resin, or a benzocyclobutene-based resin can be used. Other than such organic materials, it is also possible to use a low-dielectric constant material (a low-k material) or the like. In the case of using an organic material, a wet process such as a spin coating method or a printing method may be used to form the insulating layer 128 and the insulating layer 130.

Note that in this embodiment, a silicon nitride film is used as the insulating layer 128, and a silicon oxide film is used as the insulating layer 130.

Planarization treatment is preferably performed on the surface of the insulating layer 130 in a formation region of an oxide semiconductor film 144. In this embodiment, the oxide semiconductor film 144 is formed over the insulating layer 130 sufficiently planarized by polishing treatment such as CMP treatment (the average surface roughness of the surface of the insulating layer 130 is preferably less than or equal to 0.15 nm).

The transistor 162 illustrated in FIG. 5A includes an oxide semiconductor in the channel formation region. Here, the oxide semiconductor film 144 included in the transistor 162 is preferably highly purified. By using a highly purified oxide semiconductor, the transistor 162 which has extremely favorable off-state current characteristics can be obtained.

Since the off-state current of the transistor 162 is small, stored data can be held for a long time owing to such a transistor. In other words, power consumption can be sufficiently reduced because a semiconductor device in which refresh operation is unnecessary or the frequency of refresh operation is extremely low can be provided.

In the manufacturing process of the transistor 162, electrode layers 142a and 142b which serve as a source electrode layer and a drain electrode layer are formed in the step of removing a conductive film provided over a gate electrode 148, a sidewall insulating layer (first insulating films 136a and 136b and second insulating films 138a and 138b) by a chemical mechanical polishing method. The electrode layers 142a and 142b are in contact with the side surface of the sidewall insulating layer (the first insulating films 136a and 136b and the second insulating films 138a and 138b) and the oxide semiconductor film 144.

The sidewall insulating layer has an oxygen-excess region, which is formed in the following manner. The first insulating films 136a and 136b are formed and then subjected to oxygen doping treatment; the second insulating films 138a and 138b are formed over the first insulating films 136a and 136b; and etching is performed on the stacked layers of the first insulating films 136a and 136b and the second insulating films 138a and 138b.

The oxygen-excess region is provided in the vicinity between the first insulating films 136a and 136b and the second insulating films 138a and 138b (or in the first insulating films 136a and 136b). Thus, it is preferable that the thicknesses of the first insulating films 136a and 136b and the second insulating films 138a and 138b are adjusted such that they can serve as a sidewall insulating layer by making the first insulating films 136a and 136b on the side of the oxide semiconductor film and the gate insulating film thinner and making the second insulating films 138a and 138b thicker than the first insulating films 136a and 136b. For example, the first insulating films 136a and 136b each preferably have a thickness of greater than or equal to 20 nm and less than or equal to 50 nm (typically, 30 nm), and the second insulating films 138a and 138b each preferably have a thickness of greater than or equal to 200 nm and less than or equal to 500 nm (typically, 370 nm).

The sidewall insulating layer filled with excess oxygen in a region adjacent to the oxide semiconductor film 144 and the gate insulating film 146 prevents elimination of oxygen from the gate insulating film 146 and the oxide semiconductor film 144 and effectively serves as an oxygen supplying layer which supplies oxygen to the oxide semiconductor film 144 and the gate insulating film 146.

In the sidewall insulating layer, the excess oxygen stored in the region adjacent to the oxide semiconductor film 144 and the gate insulating film 146 can be effectively supplied to the gate insulating film 146 and the oxide semiconductor film 144. Thus, in the semiconductor device, generation of a parasitic channel can be suppressed and oxygen vacancies in the oxide semiconductor film and at the interface between the gate insulating film and the oxide semiconductor film 144 can be compensated. Further, heat treatment is performed after the oxygen doping treatment, so that oxygen can be supplied to the gate insulating film 146 and the oxide semiconductor film 144 from the oxygen-excess region.

In the transistor 162, the distance between the gate electrode 148 and a region (contact region) in which the oxide semiconductor film 144 is in contact with the electrode layer 142a or the electrode layer 142b which serves as a source electrode layer or drain electrode layer can be made short, so that the resistance between the gate electrode 148 and the region (contact region) in which the oxide semiconductor film 144 is in contact with the electrode layer 142a or the electrode layer 142b is reduced; thus, the on-state characteristics of the transistor 162 can be improved.

In a step of removing the conductive film over the gate electrode 148 in the formation process of the electrode layers 142a and 142b, precise processing can be performed accurately because an etching step using a resist mask is not performed. Consequently, in the manufacturing process of the semiconductor device, a transistor having a miniaturized structure with less variation in shape or characteristics can be manufactured with high yield.

An interlayer insulating film 135 and an insulating film 150 each of which has a single-layer structure or a stacked-layer structure are provided over the transistor 162. In this embodiment, an aluminum oxide film is used as the insulating film 150. With the aluminum oxide film having a high density (film density higher than or equal to 3.2 g/cm³, preferably higher than or equal to 3.6 g/cm³), the transistor 162 can have stable electrical characteristics.

In addition, a conductive layer 153 is provided in a region overlapping with the electrode layer 142a of the transistor 162 with the interlayer insulating film 135 and the insulating film 150 interposed therebetween, and the electrode layer 142a, the interlayer insulating film 135, the insulating film 150, and the conductive layer 153 form the capacitor 164. That is, the source electrode layer 142a of the transistor 162 functions as one electrode of the capacitor 164, and the conductive layer 153 functions as the other electrode of the capacitor 164. Note that the capacitor 164 may be omitted if it is not needed. Alternatively, the capacitor 164 may be separately provided over the transistor 162.

An insulating layer 152 is provided over the transistor 162 and the capacitor 164. In addition, a wiring 156 for connecting the transistor 162 to another transistor is provided over the insulating layer 152. Although not illustrated in FIG. 5A, the wiring 156 is electrically connected to the electrode layer 142b through an electrode formed in an opening provided in the insulating film 150, the insulating layer 152, a gate insulating film 146, and the like. Here, the electrode is preferably provided so as to partly overlap with at least the -oxide semiconductor film 144 of the transistor 162.

In FIGS. 5A and 5B, the transistor 160 is provided to overlap with at least part of the transistor 162. The source region or the drain region of the transistor 160 is preferably provided to overlap with part of the oxide semiconductor film 144. Further, the transistor 162 and the capacitor 164 are provided so as to overlap with at least part of the transistor 160. For example, the conductive layer 153 of the capacitor 164 is provided so as to overlap with at least part of the gate electrode 110 of the transistor 160. With such a planar layout, the area occupied by the semiconductor device can be reduced; thus, higher integration can be achieved.

Note that the electrical connection between the electrode layer 142b and the wiring 156 may be established by direct contact of the electrode layer 142b and the wiring 156 or through an electrode provided in an insulating layer lying therebetween. Alternatively, the electrical connection may be established through a plurality of electrodes.

Next, an example of a circuit configuration corresponding to FIGS. 5A and 5B is illustrated in FIG. 5C.

In FIG. 5C, a first wiring (1st Line) is electrically connected to a source electrode of the transistor 160. A second wiring (2nd Line) is electrically connected to a drain electrode of the transistor 160. A third wiring (a 3rd line) and one of source or drain electrodes of the transistor 162 are electrically connected to each other, and a fourth wiring (a 4th line) and a gate electrode of the transistor 162 are electrically connected to each other. A gate electrode of the transistor 160 and the other of the source or drain electrodes of the transistor 162 are electrically connected to one electrode of the capacitor 164, and a fifth wiring (a 5th line) and the other electrode of the capacitor 164 are electrically connected to each other.

The semiconductor device in FIG. 5C utilizes a characteristic in which the potential of the gate electrode of the transistor 160 can be held, and thus enables data writing, holding, and reading as follows.

Writing and holding of data will be described. First, the potential of the fourth wiring is set to a potential at which the transistor 162 is turned on, so that the transistor 162 is turned on. Accordingly, the potential of the third wiring is supplied to the gate electrode of the transistor 160 and the capacitor 164. That is, predetermined charge is given to the gate electrode of the transistor 160 (writing). Here, one of two kinds of charge providing different potentials (hereinafter referred to as a low-level charge and a high-level charge) is given. After that, the potential of the fourth wiring is set to a potential at which the transistor 162 is turned off, so that the transistor 162 is turned off. Thus, the charge given to the gate electrode of the transistor 160 is held (storing).

Since the off-state current of the transistor 162 is extremely low, the charge of the gate electrode of the transistor 160 is held for a long time.

Next, reading of data will be described. By supplying an appropriate potential (reading potential) to the fifth wiring while a predetermined potential (constant potential) is supplied to the first wiring, the potential of the second wiring varies depending on the amount of charge held in the gate electrode of the transistor 160. This is because in general, when the transistor 160 is an n-channel transistor, an apparent threshold voltage $V_{th\_H}$ in the case where a high-level charge is given to the gate electrode of the transistor 160 is lower than an apparent threshold voltage $V_{th\_L}$ in the case where a low-level charge is given to the gate electrode of the transistor 160. Here, an apparent threshold voltage refers to the potential of the fifth wiring, which is needed to turn on the transistor 160. Thus, the potential of the fifth wiring is set to a potential $V_0$ which is between $V_{th\_H}$ and $V_{th\_L}$, whereby charge given to the gate electrode of the transistor 160 can be determined. For example, in the case where a high-level charge is given in writing, when the potential of the fifth wiring is set to $V_0$ ($>V_{th\_H}$), the transistor 160 is turned on. In the case where a low-level charge is given in writing, even when the potential of the fifth wiring is set to $V_0$ ($<V_{th\_L}$), the transistor 160 remains in an off state. Therefore, the stored data can be read by the potential of the second wiring.

Note that in the case where memory cells are arrayed to be used, only data of desired memory cells needs to be read. In the case where such reading is not performed, a potential at which the transistor 160 is turned off, that is, a potential smaller than $V_{th\_H}$ may be given to the fifth wiring regardless of the state of the gate electrode of the transistor 160. Alternatively, a potential which allows the transistor 160 to be turned on regardless of a state of the gate electrode, that is, a potential higher than $V_{th\_L}$ may be applied to the fifth wiring.

When a transistor having a channel formation region formed using an oxide semiconductor and having extremely small off-state current is applied to the semiconductor device in this embodiment, the semiconductor device can store data for an extremely long period. In other words, power consumption can be adequately reduced because refresh operation becomes unnecessary or the frequency of refresh operation can be extremely low. Moreover, stored data can be held for a long period even when power is not supplied (note that a potential is preferably fixed).

Further, in the semiconductor device described in this embodiment, high voltage is not needed for writing data and there is no problem of deterioration of elements. For example, unlike a conventional non-volatile memory, it is not necessary to inject and extract electrons into and from a floating gate; thus, the problem of deterioration of a gate insulating film does not occur. In other words, the semiconductor device according to one embodiment of the present invention does not have a limit on the number of times of writing which is a problem in a conventional nonvolatile memory, and reliability thereof is drastically improved. Furthermore, data is written depending on the on state and the off state of the transistor, whereby high-speed operation can be easily realized.

As described above, a miniaturized and highly-integrated semiconductor device having stable and high electrical characteristics and a method for manufacturing the semiconductor device can be provided.

The methods and structures described in this embodiment can be combined as appropriate with any of the methods and structures described in the other embodiments.

Embodiment 4

In this embodiment, a semiconductor device which includes the transistor described in Embodiment 1 or 2, which can hold stored data even when not powered, and which does not have a limitation on the number of write cycles, and which has a structure different from the structure described in Embodiment 3 is described with reference to FIGS. 6A and 6B and FIGS. 7A and 7B.

Figure 6A:
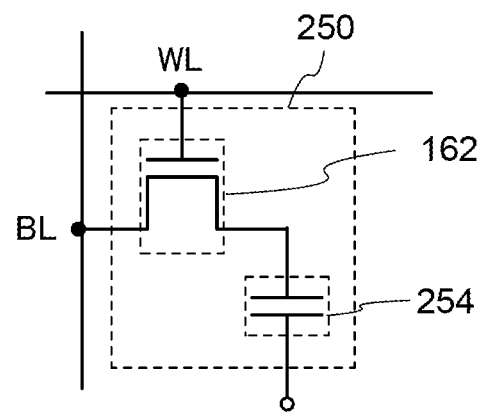
FIGS. 6A and 6B are a circuit diagram and a perspective view which illustrate one embodiment of a semiconductor device.
Figure 6B:
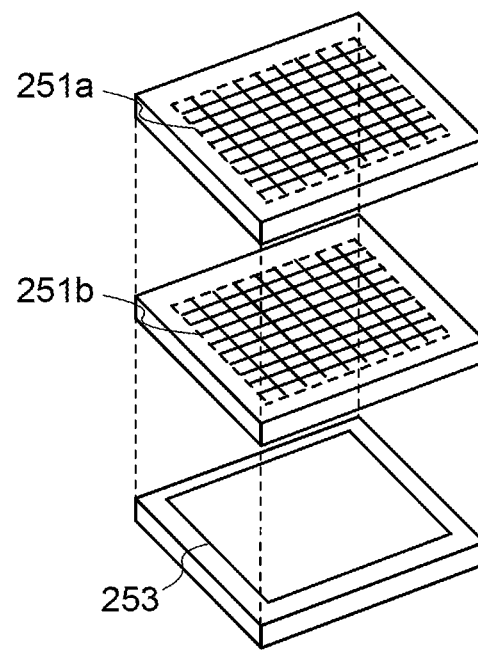

FIG. 6A illustrates an example of a circuit configuration of a semiconductor device, and FIG. 6B is a conceptual diagram illustrating an example of a semiconductor device. First, the semiconductor device illustrated in FIG. 6A will be described, and then, the semiconductor device illustrated in FIG. 6B will be described.

In the semiconductor device illustrated in FIG. 6A, a bit line BL is electrically connected to the source electrode or the drain electrode of the transistor 162, a word line WL is electrically connected to the gate electrode of the transistor 162, and the source electrode or the drain electrode of the transistor 162 is electrically connected to a first terminal of a capacitor 254.

Next, writing and holding of data in the semiconductor device (a memory cell 250) illustrated in FIG. 6A will be described.

First, the potential of the word line WL is set to a potential at which the transistor 162 is turned on, and the transistor 162 is turned on. Accordingly, the potential of the bit line BL is supplied to the first terminal of the capacitor 254 (writing). After that, the potential of the word line WL is set to a potential at which the transistor 162 is turned off, so that the transistor 162 is turned off. Thus, the potential at the first terminal of the capacitor 254 is held (holding).

Moreover, the transistor 162 including an oxide semiconductor has extremely low off-state current. For that reason, a potential of the first terminal of the capacitor 254 (or a charge accumulated in the capacitor 254) can be held for an extremely long period by turning off the transistor 162.

Secondly, reading of data will be described. When the transistor 162 is turned on, the bit line BL which is in a floating state and the capacitor 254 are electrically connected to each other, and the charge is redistributed between the bit line BL and the capacitor 254. As a result, the potential of the bit line BL is changed. The amount of change in potential of the bit line BL varies depending on the potential of the first terminal of the capacitor 254 (or the charge accumulated in the capacitor 254).

For example, the potential of the bit line BL after charge redistribution is $(C_B*V_{B0}+C*V)/(C_B+C)$, where V is the potential of the first terminal of the capacitor 254, C is the capacitance of the capacitor 254, $C_B$ is the capacitance of the bit line BL (hereinafter also referred to as bit line capacitance), and $V_{B0}$ is the potential of the bit line BL before the charge redistribution. Therefore, it can be found that assuming that the memory cell 250 is in either of two states in which the potentials of the first terminal of the capacitor 254 are $V_1$ and $V_0$ ($V_1 > V_0$), the potential of the bit line BL in the case of holding the potential $V_1$ ($=(C_B*V_{B0}+C*V_1)/(C_B+C)$) is higher than the potential of the bit line BL in the case of holding the potential $V_0$ ($=(C_B*V_{B0}+C*V_0)/(C_B+C)$).

Then, by comparing the potential of the bit line BL with a predetermined potential, data can be read.

As described above, the semiconductor device illustrated in FIG. 6A can hold charge that is accumulated in the capacitor 254 for a long time because the off-state current of the transistor 162 is extremely small. In other words, power consumption can be adequately reduced because refresh operation becomes unnecessary or the frequency of refresh operation can be extremely low. Moreover, stored data can be stored for a long time even when power is not supplied.

Next, the semiconductor device illustrated in FIG. 6B will be described.

The semiconductor device illustrated in FIG. 6B includes a memory cell array 251 (memory cell arrays 251a and 251b) including a plurality of memory cells 250 illustrated in FIG. 6A as memory circuits in the upper portion, and a peripheral circuit 253 in the lower portion which is necessary for operating the memory cell array 251 (the memory cell arrays 251a and 251b). Note that the peripheral circuit 253 is electrically connected to the memory cell array 251.

In the structure illustrated in FIG. 6B, the peripheral circuit 253 can be provided under the memory cell array 251 (the memory cell arrays 251a and 251b). Thus, the size of the semiconductor device can be decreased.

It is preferable that a semiconductor material of the transistor provided in the peripheral circuit 253 be different from that of the transistor 162. For example, silicon, germanium, silicon germanium, silicon carbide, gallium arsenide, or the like can be used, and a single crystal semiconductor is preferably used. Alternatively, an organic semiconductor material or the like may be used. A transistor including such a semiconductor material can operate at sufficiently high speed. Therefore, a variety of circuits (e.g., a logic circuit or a driver circuit) which needs to operate at high speed can be favorably realized by the transistor.

Note that FIG. 6B illustrates, as an example, the semiconductor device in which two memory cell arrays 251 (the memory cell array 251a and the memory cell array 251b) are stacked; however, the number of stacked memory cell arrays is not limited thereto. Three or more memory cells may be stacked.

Next, a specific structure of the memory cell 250 illustrated in FIG. 6A will be described with reference to FIGS. 7A and 7B.

Figure 7A:
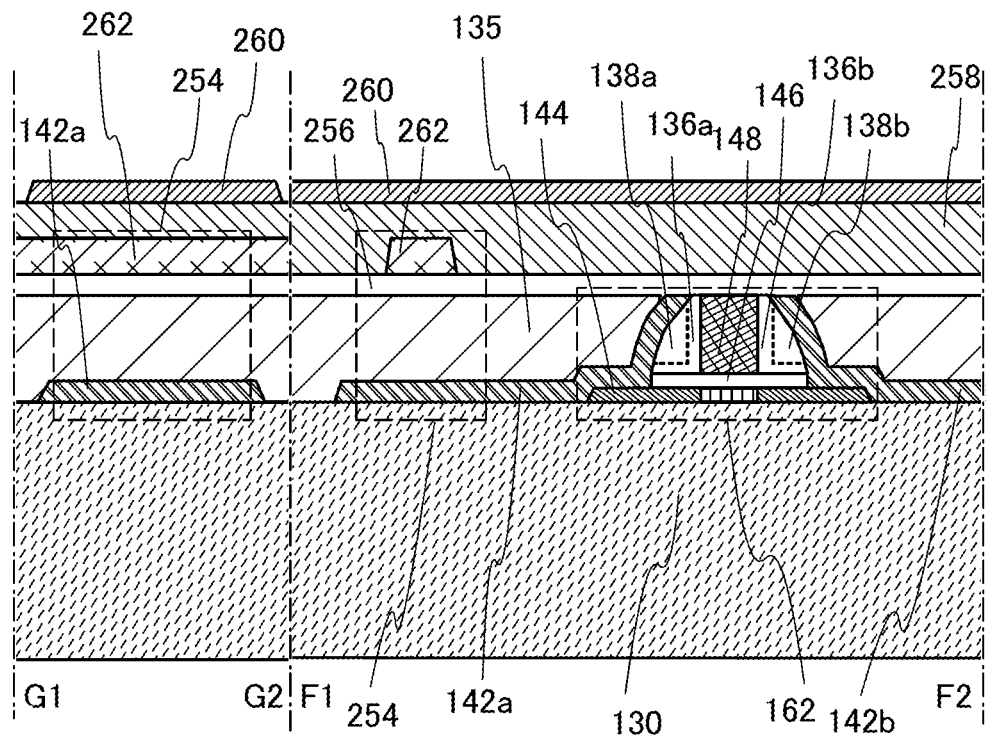
FIGS. 7A and 7B are a cross-sectional view and a plan view which illustrate one embodiment of a semiconductor device.
Figure 7B:
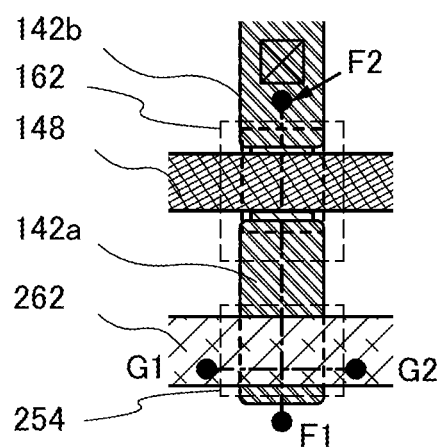

FIGS. 7A and 7B illustrate an example of a structure of the memory cell 250. FIG. 7A is a cross-sectional view of the memory cell 250, and FIG. 7B is a plan view of the memory cell 250. Here, FIG. 7A illustrates a cross section taken along line F1-F2 and line G1-G2 in FIG. 7B.

The transistor 162 in FIGS. 7A and 7B can have the same structure as the transistor in Embodiment 1 or 2.

An insulating film 256 having a single-layer structure or a stacked-layer structure is provided over the transistor 162 over the insulating layer 130. In addition, a conductive layer 262 is provided in a region overlapping with the electrode layer 142a of the transistor 162 with the insulating layer 256 interposed therebetween, and the electrode layer 142a, the interlayer insulating film 135, the insulating layer 256, and the conductive layer 262 form the capacitor 254. That is, the electrode layer 142a of the transistor 162 functions as one electrode of the capacitor 254, and the conductive layer 262 functions as the other electrode of the capacitor 254.

An insulating film 258 is provided over the transistor 162 and the capacitor 254. Further, a wiring 260 for connecting the memory cell 250 to an adjacent memory cell 250 is provided over the insulating film 258. Although not illustrated, the wiring 260 is electrically connected to the electrode layer 142b of the transistor 162 through an opening provided in the insulating layer 256, the insulating film 258, and the like. The wiring 260 may be electrically connected to the electrode layer 142b through another conductive layer provided in the opening. Note that the wiring 260 corresponds to the bit line BL in the circuit diagram of FIG. 6A.

In FIGS. 7A and 7B, the electrode layer 142b of the transistor 162 can also function as a source electrode of a transistor included in an adjacent memory cell.

When the planar layout in FIG. 7A is employed, the area occupied by the semiconductor device can be reduced; thus, the degree of integration can be increased.

As described above, the plurality of memory cells formed in multiple layers in the upper portion is each formed with a transistor including an oxide semiconductor. Since the off-state current of the transistor including an oxide semiconductor is small, stored data can be held for a long time owing to such a transistor. In other words, the frequency of refresh operation can be extremely lowered, which leads to a sufficient reduction in power consumption.

A semiconductor device having a novel feature can be obtained by being provided with both a peripheral circuit including the transistor including a material other than an oxide semiconductor (in other words, a transistor capable of operating at sufficiently high speed) and a memory circuit including the transistor including an oxide semiconductor (in a broader sense, a transistor whose off-state current is sufficiently small). In addition, with a structure where the peripheral circuit and the memory circuit are stacked, the degree of integration of the semiconductor device can be increased.

As described above, a miniaturized and highly-integrated semiconductor device having stable and high electrical characteristics and a method for manufacturing the semiconductor device can be provided.

This embodiment can be implemented in appropriate combination with the structures described in the other embodiments.

Embodiment 5

In this embodiment, examples of application of the semiconductor device described in any of the above embodiments to portable devices such as cellular phones, smartphones, or electronic books will be described with reference to FIGS. 8A and 8B, FIG. 9, FIG. 10 and FIG. 11.

In portable devices such as a mobile phone, a smart phone, and an e-book reader, an SRAM or a DRAM is used so as to store image data temporarily. This is because response speed of a flash memory is low and thus a flash memory is not suitable for image processing. On the other hand, an SRAM or a DRAM has the following characteristics when used for temporary storage of image data.

Figure 8A:
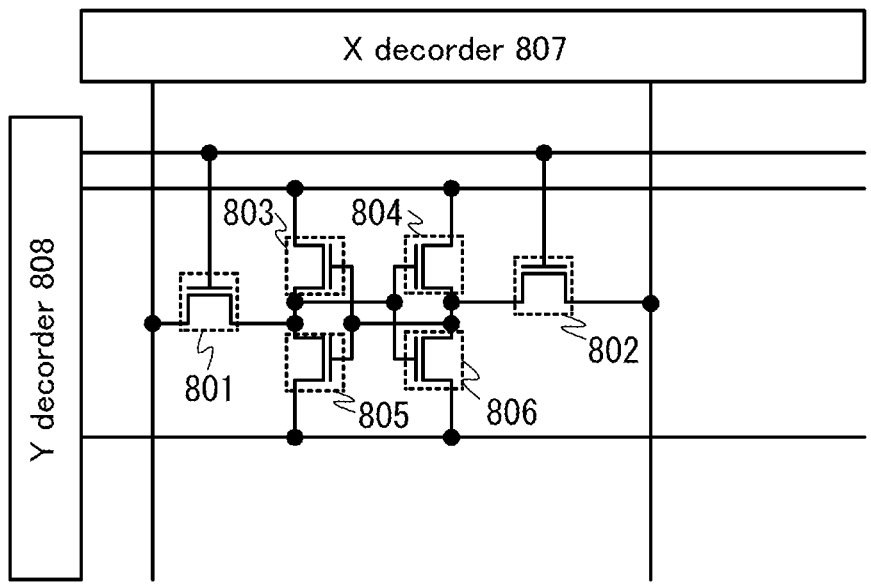
FIGS. 8A and 8B are circuit diagrams each illustrating one embodiment of a semiconductor device.

In an ordinary SRAM, as illustrated in FIG. 8A, one memory cell includes six transistors, that is, transistors 801 to 806, which are driven with an X decoder 807 and a Y decoder 808. The transistors 803 and 805 and the transistors 804 and 806 each serve as an inverter, and high-speed driving can be performed therewith. However, an SRAM has a disadvantage of large cell area because one memory cell includes six transistors. Provided that the minimum feature size of a design rule is F, the area of a memory cell in an SRAM is generally $100 F^2$ to $150 F^2$. Therefore, a price per bit of an SRAM is the most expensive among a variety of memory devices.

Figure 8B:
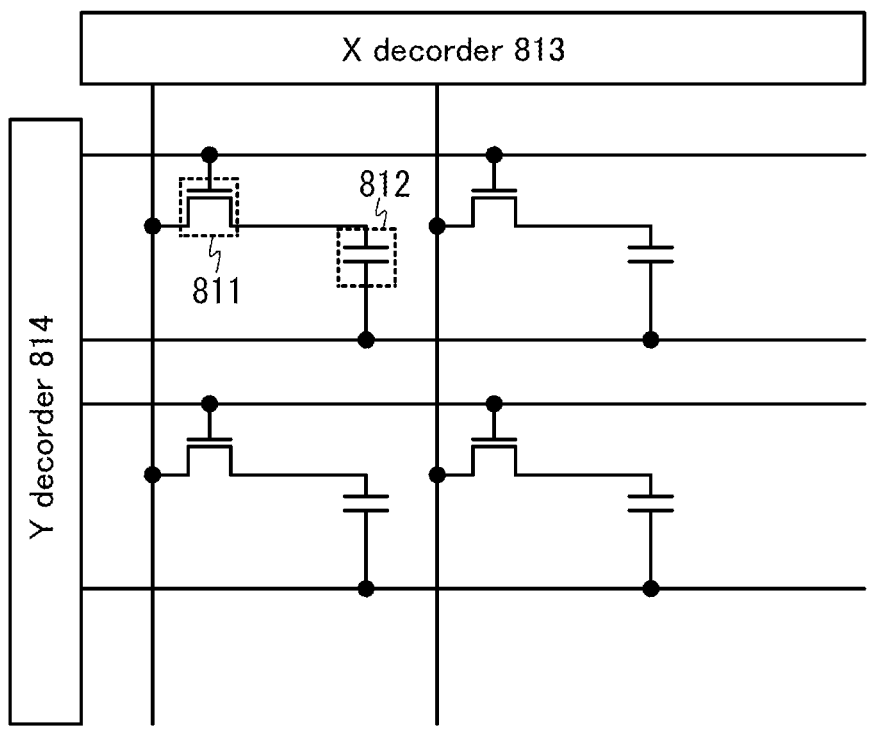

In a DRAM, as illustrated in FIG. 8B, a memory cell includes a transistor 811 and a storage capacitor 812, which are driven with an X decoder 813 and a Y decoder 814. One cell includes one transistor and one capacitor and thus the area of a memory cell is small. The area of a memory cell of a DRAM is generally less than or equal to $10 F^2$. Note that in the case of a DRAM, a refresh operation is always necessary and power is consumed even when a rewriting operation is not performed.

However, the area of the memory cell of the semiconductor device described in the above embodiments is about $10 F^2$ and frequent refreshing is not needed. Therefore, the area of the memory cell is reduced, and the power consumption can be reduced.

Next, FIG. 9 is a block diagram of a portable device. The portable device illustrated in FIG. 9 includes an RF circuit 901, an analog baseband circuit 902, a digital baseband circuit 903, a battery 904, a power supply circuit 905, an application processor 906, a flash memory 910, a display controller 911, a memory circuit 912, a display 913, a touch sensor 919, an audio circuit 917, a keyboard 918, and the like. The display 913 includes a display portion 914, a source driver 915, and a gate driver 916. The application processor 906 includes a CPU 907, a DSP 908, and an interface (IF) 909. In general, the memory circuit 912 includes an SRAM or a DRAM; by employing the semiconductor device described in any of the above embodiments for the memory circuit 912, writing and reading of data can be performed at high speed, data can be held for a long time, and power consumption can be sufficiently reduced.

Figure 10:
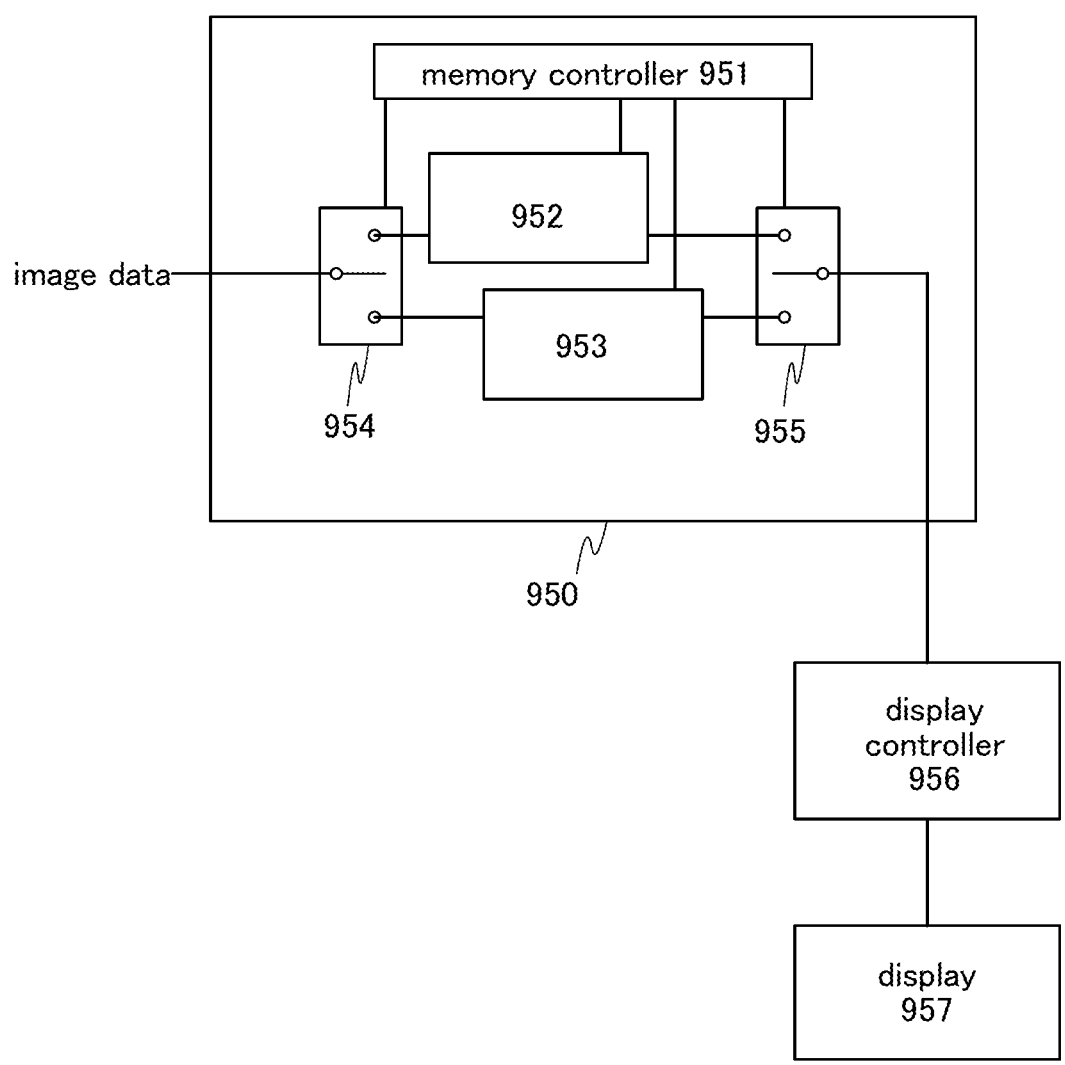
FIG. 10 is a block diagram illustrating one embodiment of a semiconductor device.

FIG. 10 illustrates an example of using the semiconductor device described in any of the above embodiments in a memory circuit 950 for a display. The memory circuit 950 illustrated in FIG. 10 includes a memory 952, a memory 953, a switch 954, a switch 955, and a memory controller 951. Further, the memory circuit is connected to a display controller 956 which reads and controls image data input through a signal line (input image data) and data stored in the memories 952 and 953 (stored image data), and is also connected to a display 957 which displays an image based on a signal input from the display controller 956.

First, image data (input image data A) is formed by an application processor (not illustrated). The input image data A is held in the memory 952 though the switch 954. The image data (stored image data A) held in the memory 952 is transmitted and displayed to the display 957 through the switch 955 and the display controller 956.

In the case where the input image data A is not changed, the stored image data A is read from the memory 952 through the switch 955 by the display controller 956 normally at a frequency of 30 Hz to 60 Hz.

Next, for example, when data displayed on the screen is rewritten by a user (that is, in the case where the input image data A is changed), new image data (input image data B) is formed by the application processor. The input image data B is held in the memory 953 through the switch 954. The stored image data A is read periodically from the memory 952 through the switch 955 even during that time. After the completion of storing the new image data (the stored image data B) in the memory 953, from the next frame for the display 957, the stored image data B starts to be read, transmitted to the display 957 through the switch 955 and the display controller 956, and displayed on the display 957. This reading operation is continued until another new image data is held in the memory 952.

Accordingly, image data is alternately written and read in the memories 952 and 953 so as to be displayed on the display 957. Note that the memory 952 and the memory 953 are not limited to separate memories, and a single memory may be divided and used. By employing the semiconductor device described in any of the above embodiments for the memory 952 and the memory 953, data can be written and read at high speed and held for a long time, and power consumption can be sufficiently reduced.

Figure 11:
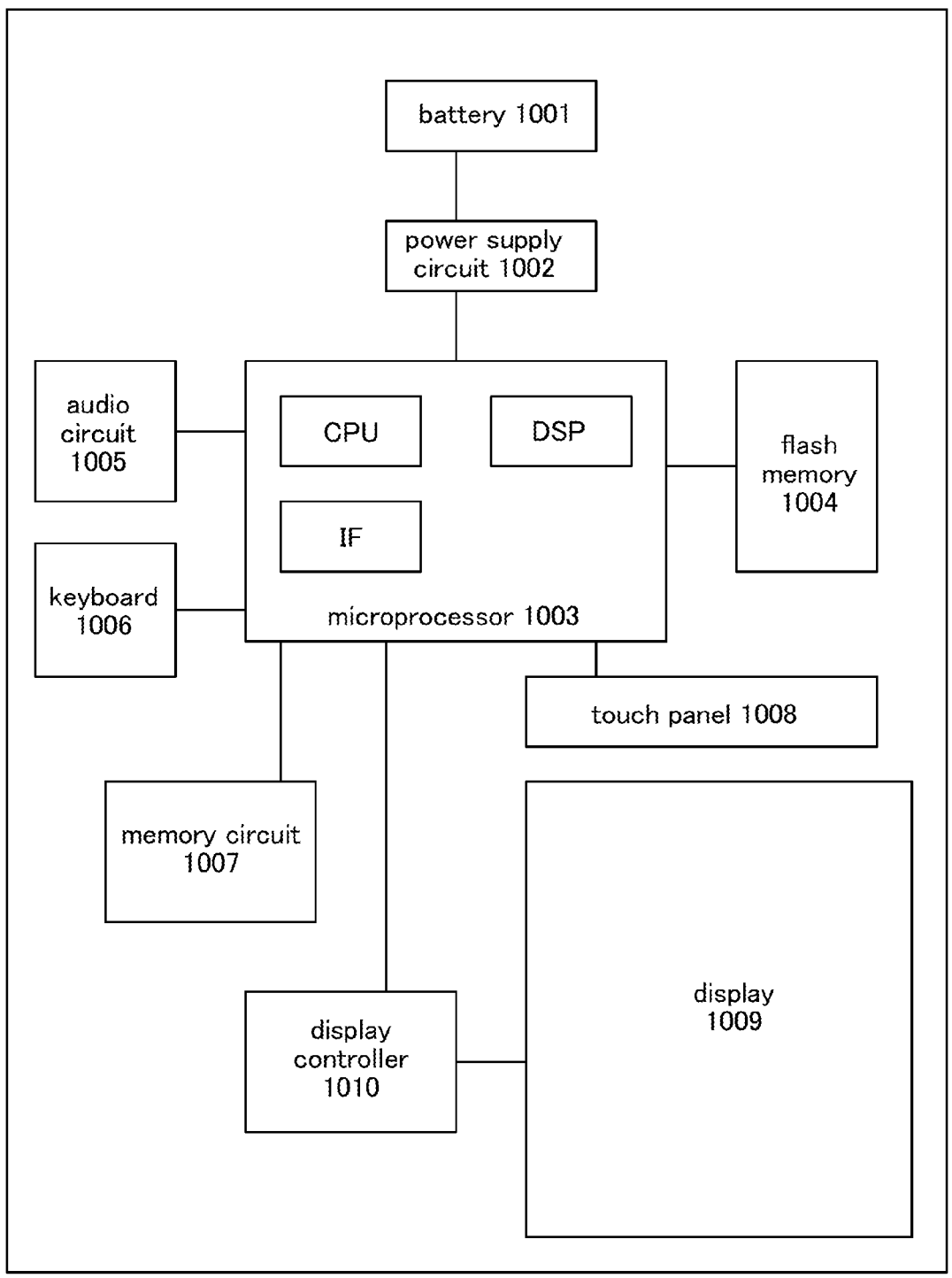
FIG. 11 is a block diagram illustrating one embodiment of a semiconductor device.

FIG. 11 is a block diagram of an e-book reader. FIG. 11 includes a battery 1001, a power supply circuit 1002, a microprocessor 1003, a flash memory 1004, an audio circuit 1005, a keyboard 1006, a memory circuit 1007, a touch panel 1008, a display 1009, and a display controller 1010.

Here, the semiconductor device described in any of the above embodiments can be used for the memory circuit 1007 in FIG. 11. The memory circuit 1007 has a function of temporarily storing the contents of a book. For example, users use a highlight function in some cases. When users read an e-book reader, they sometimes want to mark a specified place. This marking refers to a highlight function, and users can make difference from other places by, for example, changing the color of a letter displayed, underlining a word, making a letter bold, or changing the font type of a letter. That is, there is a function of storing and holding information of a place specified by users. In order to save information for a long time, the information may be copied into the flash memory 1004. Even in such a case, by employing the semiconductor device described in any of the above embodiments, writing and reading of data can be performed at high speed, data can be held for a long time, and power consumption can be sufficiently reduced.

As described above, the semiconductor device in any of the above embodiments is mounted on each of the portable devices described in this embodiment. Therefore, a portable device in which writing and reading of data are performed at high speed, data is held for a long time, and power consumption is sufficiently reduced, can be obtained.

The structures, methods, and the like described in this embodiment can be combined as appropriate with any of the structures, methods, and the like described in the other embodiments.

This application is based on Japanese Patent Application serial no. 2012-014049 filed with Japan Patent Office on Jan. 26, 2012, the entire contents of which are hereby incorporated by reference.

What is claimed is:

1. A semiconductor device comprising:
    an oxide semiconductor film provided over an oxide insulating film and including a channel formation region;
    a gate insulating film over the oxide semiconductor film;
    a gate electrode layer over the gate insulating film;
    a sidewall insulating layer including a first insulating film and a second insulating film;
    a third insulating film over and in contact with the gate electrode layer; and
    a source electrode layer and a drain electrode layer which are electrically connected to the oxide semiconductor film,
    wherein the sidewall insulating layer has an oxygen-excess region,
    wherein the first insulating film is in contact with a part of a top surface of the gate insulating film and side surfaces of the gate electrode layer and the third insulating film, and
    wherein the second insulating film is in contact with a top surface and a side surface of the first insulating film.

2. The semiconductor device according to claim 1, wherein the second insulating film is thicker than the first insulating film.

3. The semiconductor device according to claim 2, wherein the first insulating film has a thickness of greater than or equal to 20 nm and less than or equal to 50 nm.

4. The semiconductor device according to claim 2, wherein the second insulating film has a thickness of greater than or equal to 200 nm and less than or equal to 500 nm.

5. The semiconductor device according to claim 1, wherein the sidewall insulating layer has the oxygen-excess region by performing oxygen doping treatment on the first insulating film and providing the second insulating film in contact with the first insulating film after the oxygen doping treatment.

6. The semiconductor device according to claim 1, wherein a region of the oxide semiconductor film, which does not overlap with the gate electrode layer, includes an impurity element.

7. The semiconductor device according to claim 1, wherein an aluminum oxide film is provided as a barrier film over the oxide semiconductor film, the gate insulating film, and the sidewall insulating layer.

8. The semiconductor device according to claim 1, wherein the source electrode layer and the drain electrode layer are in contact with the oxide semiconductor film and the sidewall insulating layer.

9. A semiconductor device comprising:
    an oxide semiconductor film provided over an oxide insulating film and including a channel formation region;
    a gate insulating film over the oxide semiconductor film;
    a gate electrode layer over the gate insulating film;
    a sidewall insulating layer including a first insulating film and a second insulating film;
    a third insulating film over and in contact with the gate electrode layer; and
    a source electrode layer and a drain electrode layer which are electrically connected to the oxide semiconductor film,
    wherein the first insulating film is in contact with a part of a top surface of the gate insulating film and side surfaces of the gate electrode layer and the third insulating film, and
    wherein the second insulating film is in contact with a top surface and a side surface of the first insulating film.

10. The semiconductor device according to claim 9, wherein the second insulating film is thicker than the first insulating film.

11. The semiconductor device according to claim 10, wherein the first insulating film has a thickness of greater than or equal to 20 nm and less than or equal to 50 nm.

12. The semiconductor device according to claim 10, wherein the second insulating film has a thickness of greater than or equal to 200 nm and less than or equal to 500 nm.

13. The semiconductor device according to claim 9, wherein a region of the oxide semiconductor film, which does not overlap with the gate electrode layer, includes an impurity element.

14. The semiconductor device according to claim 9, wherein an aluminum oxide film is provided as a barrier film over the oxide semiconductor film, the gate insulating film, and the sidewall insulating layer.

15. The semiconductor device according to claim 9, wherein the source electrode layer and the drain electrode layer are in contact with the oxide semiconductor film and the sidewall insulating layer.

* * * * *